(12) United States Patent
Miyanami

(10) Patent No.: US 10,615,208 B2
(45) Date of Patent: *Apr. 7, 2020

(54) SOLID-STATE IMAGING DEVICE, MANUFACTURING METHOD THEREOF, AND ELECTRONIC APPARATUS

(71) Applicant: Sony Corporation, Tokyo (JP)

(72) Inventor: Yuki Miyanami, Kanagawa (JP)

(73) Assignee: SONY CORPORATION, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 16/366,835

(22) Filed: Mar. 27, 2019

(65) Prior Publication Data

US 2019/0221593 A1 Jul. 18, 2019

Related U.S. Application Data

(63) Continuation of application No. 15/719,824, filed on Sep. 29, 2017, now Pat. No. 10,256,267, which is a continuation of application No. 15/266,713, filed on Sep. 15, 2016, now Pat. No. 9,806,118, which is a continuation of application No. 14/820,888, filed on (Continued)

(30) Foreign Application Priority Data

Feb. 24, 2011 (JP) .................. 2011-038443

(51) Int. Cl.
| | |
|---|---|
| H01L 27/146 | (2006.01) |
| H04N 5/378 | (2011.01) |
| H04N 5/3745 | (2011.01) |
| H04N 9/083 | (2006.01) |

(52) U.S. Cl.
CPC ...... *H01L 27/1463* (2013.01); *H01L 27/1464* (2013.01); *H01L 27/14612* (2013.01); *H01L 27/14621* (2013.01); *H01L 27/14623* (2013.01); *H01L 27/14636* (2013.01); *H01L 27/14641* (2013.01); *H01L 27/14645* (2013.01); *H01L 27/14685* (2013.01); *H04N 5/378* (2013.01);

(Continued)

(58) Field of Classification Search
CPC ............... H01L 27/146; H01L 27/1463; H01L 27/14612; H01L 27/1464; H01L 27/1461; H01L 27/14623; H01L 27/14636; H01L 27/14641; H01L 27/14645; H01L 27/14685; H01L 27/14621; H01L 27/14618; H01L 27/14627; H01L 31/00; H01L 31/02; H01L 31/18; H01L 31/14; H01L 31/143; H01L 31/0232; H01L 31/112; H01L 31/113; H01L 31/162; H01L 31/0248
USPC ....................................................... 257/432
See application file for complete search history.

(56) References Cited

U.S. PATENT DOCUMENTS 10,256,267 B2 * 4/2019 Miyanami ......... H01L 27/14621

* cited by examiner

*Primary Examiner* — Chuong A Luu
(74) *Attorney, Agent, or Firm* — Sheridan Ross P.C.

(57) ABSTRACT

A solid-state imaging device includes a plurality of photoelectric conversion portions each provided to correspond to each of a plurality of pixels in a semiconductor substrate and receiving incident light through a light sensing surface, and a pixel separation portion that is embedded into a trench provided on a side portion of the photoelectric conversion portion and electrically separates the plurality of pixels in a side of an incident surface of the semiconductor substrate into which the incident light enters. The pixel separation portion is formed by an insulation material which absorbs the incident light entering the light sensing surface.

20 Claims, 27 Drawing Sheets

Related U.S. Application Data

Aug. 7, 2015, now Pat. No. 9,478,572, which is a continuation of application No. 13/370,400, filed on Feb. 10, 2012, now Pat. No. 9,153,612.

(52) U.S. Cl.
CPC ......... *H04N 5/37457* (2013.01); *H04N 9/083* (2013.01)

SOLID-STATE IMAGING DEVICE, MANUFACTURING METHOD THEREOF, AND ELECTRONIC APPARATUS

CROSS-REFERENCE TO RELATED APPLICATIONS

This application is a continuation of U.S. patent application Ser. No. 15/719,824, filed Sep. 29, 2017, which is a continuation of U.S. patent application Ser. No. 15/266,713, filed Sep. 15, 2016, now U.S. Pat. No. 9,806,118, which is a continuation of U.S. patent application Ser. No. 14/820,888, filed Aug. 7, 2015, now U.S. Pat. No. 9,478,572, which is a continuation of U.S. patent application Ser. No. 13/370,400, filed Feb. 10, 2012, now U.S. Pat. No. 9,153,612, which claims priority to Japanese Patent Application No. JP 2011-038443, filed in the Japan Patent Office on Feb. 24, 2011, the entire disclosures of which are hereby incorporated herein by reference.

BACKGROUND

The present disclosure relates to a solid-state imaging device, a manufacturing method thereof, and an electronic apparatus.

Electronic apparatuses such as a digital video camera or a digital still camera include a solid-state imaging device. For example, the solid-state imaging device includes a CCD (Charge Coupled Device) type image sensor or a CMOS (Complementary Metal Oxide Semiconductor) type image sensor.

In the solid-state imaging device, a plurality of pixels are arranged on a pixel region of a substrate. A photoelectric conversion portion is provided on each pixel. For example, the photoelectric conversion portion is a photodiode, and receives incident light through the light sensing surface and generates a signal charge by performing a photoelectric conversion with respect to the received light.

Among the solid-state imaging devices, in the CCD type image sensor, a vertical transfer portion is provided between a plurality of pixel columns which are vertically lined up in a pixel region. In the vertical transfer portion, a plurality of transfer electrodes are provided so as to be facing a vertical channel region through gate insulating films, and the vertical transfer portion is configured so as to transfer the signal charge, which is read from the photoelectric conversion portion by a charge readout portion, in a vertical direction.

In contrast, in the CMOS type image sensor, pixels are configured so as to include a pixel transistor in addition to the photoelectric conversion portion. The pixel transistor is configured so as to read the signal charge generated by the photoelectric conversion portion and output the read signal charge to a signal line as an electric signal.

In general, in the solid-state imaging device, the photoelectric conversion portion receives light incident from a front surface side on which circuit elements, wirings, or the like are provided in a substrate. In the cases of the "front surface illumination type", since the circuit elements or wirings shield the incident light, it may be difficult to improve sensitivity.

Thereby, "a rear surface illumination type" has been suggested in which the photoelectric conversion portion receives the light incident from a rear surface side which is a side opposite to the front surface on which the circuit elements, the wirings, or the like are provided in the substrate. Also in the "rear surface illumination type", the incident light entering one pixel may not enter the photodiode of this one pixel and enter photodiodes of adjacent other pixels. For example, when the incident light enters in a largely inclined state, the light does not enter the photodiode of the pixel just below the light and enters the photodiodes of other pixels. Thereby, since noise is included in the signal due to the optical phenomenon, quality of the captured image may be decreased. In order to suppress occurrence of this disadvantage, light shielding films are provided between a plurality of pixels (for example, refer to Japanese Unexamined Patent Application Publication Nos. 2010-109295 and 2010-186818).

Moreover, in the solid-state imaging device, in order to suppress a dark current from being generated due to an interface state of the semiconductor substrate on which the photoelectric conversion portion is provided, the photoelectric conversion portion of an HAD (Hole Accumulation Diode) structure has been suggested. In the HAD structure, since a positive charge (hole) accumulation region is formed on a light sensing surface of a n-type charge accumulation region, occurrence of the dark current is suppressed. In addition, in order to form the positive charge accumulation region in the interface portion of the photoelectric conversion portion, further suppressing occurrence of the dark current by providing "a film having a negative fixed charge" as a pinning layer has been suggested. For example, a high dielectric constant film such as a hafnium oxide film ($HfO_2$ film) is used as the "film having a negative fixed charge" (for example, refer to Japanese Unexamined Patent Application Publication No. 2008-306154 or the like).

Moreover, in the solid-state imaging device, in order to prevent the signal outputs from each pixel from being mixed due to electric noise, a pixel separation portion which electrically separates a plurality of pixels is provided. For example, the pixel separation portion is provided by ion-implanting impurities to the semiconductor substrate.

SUMMARY

FIG. 27 is a cross-sectional view illustrating a main portion of a pixel P in the CMOS image sensor of the "rear surface illumination type".

As illustrated in FIG. 27, in the CMOS image sensor of the "rear surface illumination type", a photodiode 21 is provided in a portion which is divided by a pixel separation portion 101*pb* in the inner portion of a semiconductor substrate 101. In the photodiode 21, an n-type impurity region 101*n* is provided as a charge accumulation region. The photodiode 21 is an HAD structure, and the n-type impurity region 101*n* is formed so as to be interposed between p-type semiconductor regions 101*pa* and 101*pc* in the depth direction z of the semiconductor substrate 101.

Although not illustrated in FIG. 27, a pixel transistor is provided on the front surface (lower surface in FIG. 27) of the semiconductor substrate 101, and as illustrated in FIG. 27, a wiring layer 111 is provided so as to cover the pixel transistor. The wiring layer 111 is formed so that wirings 111*h* are covered by an insulating layer 111*z*. In addition, a supporting substrate SS is provided on the front surface (lower surface) of the wiring layer 111.

In contrast, a light shielding film 60, a color filter CF, and a microlens ML are provided on the rear surface (upper surface in FIG. 27) of the semiconductor substrate 101, and the photodiode 21 receives the incident light H which enters via each of the portions.

Here, as illustrated in FIG. 27, for example, the light shielding film 60 is formed on the upper surface of the semiconductor substrate 101 via an insulating film SZ which is a silicon oxide film. The light shielding film 60 is provided above the pixel separation portion 101*pb* provided in the inner portion of the semiconductor substrate 101, and the upper portion of a light sensing surface JS is opened. For example, the light shielding film 60 is formed by using a light shielding material such as metal.

Moreover, the upper surface of the light shielding film 60 is covered by a planarized film HT, and the color filter CF and the microlens ML are provided on the upper surface of the planarized film HT. For example, in the color filter CF, each filter layer of three primary colors is arranged for each pixel P by a Bayer array.

When manufacturing the solid-state imaging device, first, the photodiode 21 and the pixel separation portion 101*pb* are formed by ion-implanting impurities from the front surface side (lower surface side in FIG. 27) of the semiconductor substrate 101. Moreover, after members such as the pixel transistor (not illustrated) or the like are formed on the front surface (lower surface) side of the semiconductor substrate 101, the wiring layer 111 is formed so as to cover the front surface (lower surface). Moreover, the supporting substrate SS is bonded onto the front surface (lower surface) of the wiring layer 111. Thereafter, a film-thinning treatment is performed in which the rear surface (upper surface) side of the semiconductor substrate 101 is grounded. Moreover, each of members such as the insulating film SZ, the light shielding film 60, the planarized film HT, the color filter CF, and the microlens ML is sequentially provided on the rear surface (upper surface) side of the semiconductor substrate 101. In this way, the solid-state imaging device is manufactured.

In the solid-state imaging device, the light shielding film 60 is formed on the rear surface (upper surface) of the semiconductor substrate 101, and the incident light H entering one pixel P may be transmitted below the light shielding film 60 and may enter the photodiode 21 of another adjacent pixel P. For example, when the incident light H enters in a largely inclined state, the incident light H may pass through the pixel separation portion 101*pb* which is formed by the ion implantation of impurities and may enter the photodiode 21 of the other adjacent pixel P. Moreover, similarly, irregularly reflected light may enter the photodiode 21 of the other pixel P. Thereby, so-called "color mixing" may be generated, color reproducibility in the captured color image may be decreased, and the image quality may be decreased.

In the "rear surface illumination type" solid-state imaging device, the light H incident from the rear surface (upper surface) side of the semiconductor substrate 101 enters the light sensing surface JS of the photodiode 21. Thereby, the "color mixing" is often generated in the vicinity of the rear surface (upper surface) of the semiconductor substrate 101.

As described above, in the "rear surface illumination type" solid-state imaging device, the pixel separation portion 101*pb* is formed by ion-implanting impurities with a high energy from the front surface side (lower surface side in FIG. 27) of the semiconductor substrate 101 and performing an annealing treatment. Thereby, in the rear surface (upper surface) side of the semiconductor substrate 101 into which the incident light H enters, since the impurities which are ion-implanted from the front surface (lower surface) side are dispersed in a transverse direction, as illustrated in FIG. 27, the width of the pixel separation portion 101*pb* is formed to be widened to the rear surface (upper surface) side. Thereby, the electric field in the transverse direction is weak in the rear surface (upper surface) side of the semiconductor substrate 101 (refer to Japanese Unexamined Patent Application Publication No. 2003-318122). Therefore, due to this, the "color mixing" may be more often generated in the vicinity of the rear surface (upper surface) of the semiconductor substrate 101.

Particularly, a charge generated by the pixel which receives a short wavelength light such as blue may move to the adjacent pixels which receive the light of the other color, and occurrence of the "color mixing" may be obvious. This is due to the fact that light having the shorter wavelength is absorbed in the vicinity of the rear surface (upper surface) into which the light enters in the semiconductor substrate 101 configured of a single crystal silicon semiconductor.

Besides this, as described above, since the width of the pixel separation portion 101*pb* is widened, it may be difficult to widen the occupancy area of the photodiode 21. Therefore, a saturation charge accumulation amount (Qs) of the photodiode 21 is decreased, a dynamic range is deteriorated, and in some case, it is difficult to improve the quality of the captured image.

Occurrence of the above described disadvantages is not limited to the case of the "rear surface illumination type" and may be generated in the case of the "front surface illumination type" solid-state imaging device.

In the case of the "front surface illumination type", since impurities are ion-implanted from the front surface side into which the incident light enters in the semiconductor substrate and the pixel separation portion is formed, the width of the pixel separation portion is widened and formed in the deeper portion from the front surface. In addition, in the semiconductor substrate configured of a single crystal silicon semiconductor, the light having a shorter wavelength is absorbed in the vicinity of the front surface into which the light enters. However, the light having a longer wavelength reaches the deeper portion of the semiconductor substrate. Thereby, particularly, since it is difficult to improve the saturation charge accumulation amount (Qs) of the pixel which receives the light having a longer wavelength such as red, quality of the captured image may not be easily improved.

In this way, in the solid-state imaging device, improvement of quality of the captured image may be difficult.

Therefore, it is desirable to provide a solid-state imaging device, a manufacturing method thereof, and an electronic apparatus capable of improving quality or the like of a captured image.

According to an embodiment of the present disclosure, there is provided a solid-state imaging device which includes a plurality of photoelectric conversion portions each provided to correspond to each of a plurality of pixels in a semiconductor substrate and receiving incident light through a light sensing surface, and a pixel separation portion that is embedded into a trench provided on a side portion of the photoelectric conversion portion and electrically separates the plurality of pixels in a side of an incident surface of the semiconductor substrate into which the incident light enters, and the pixel separation portion is formed by an insulation material which absorbs the incident light entering the light sensing surface.

According to another embodiment of the present disclosure, there is provided a method of manufacturing a solid-state imaging device which includes providing a plurality of photoelectric conversion portions which receive incident light through a light sensing surface so as to correspond to a plurality of pixels in the semiconductor substrate, and forming a pixel separation portion that electrically separates the plurality of pixels so as to be embedded into a trench provided on a side portion of the photoelectric conversion portion in a side of an incident surface of the semiconductor into which the incident light enters, and the pixel separation portion is formed by an insulation material which absorbs the incident light entering the light sensing surface when forming the pixel separation portion.

According to another embodiment of the present disclosure, there is provided an electric apparatus which includes a plurality of photoelectric conversion portions each provided to correspond to each of a plurality of pixels in a semiconductor substrate and receiving incident light through a light sensing surface, and a pixel separation portion that is embedded into a trench provided on a side portion of the photoelectric conversion portion and electrically separates the plurality of pixels in a side of an incident surface of the semiconductor substrate into which the incident light enters, and the pixel separation portion is formed by an insulation material which absorbs the incident light entering the light sensing surface.

According to the present disclosure, it is possible to provide a solid-state imaging device, a manufacturing method thereof, and an electronic apparatus capable of improving quality or the like of the captured image.

DETAILED DESCRIPTION OF EMBODIMENTS

Embodiments of the present disclosure will be described with reference to the drawings.

In addition, description is performed in the following order.

1. First Embodiment (Case where Pixel Separation Portion is Single Layer)
2. Second Embodiment (Case where Pinning layer is Provided in Periphery of Pixel Separation Portion)
3. Third Embodiment (Case where Pixel Separation Portion Includes Two Different Light Absorption Portions)
4. Fourth Embodiment (Case where Pixel Separation Portion Includes Three Different Light Absorption Portions)
5. Fifth Embodiment (Case of Front Surface Illumination Type)
6. Others 1. First Embodiment (A) Apparatus Configuration
(A-1) Main Portion Configuration of Camera FIG. 1 is a configuration diagram illustrating a configuration of a camera 40 in a first embodiment of the present disclosure.

Figure 1:
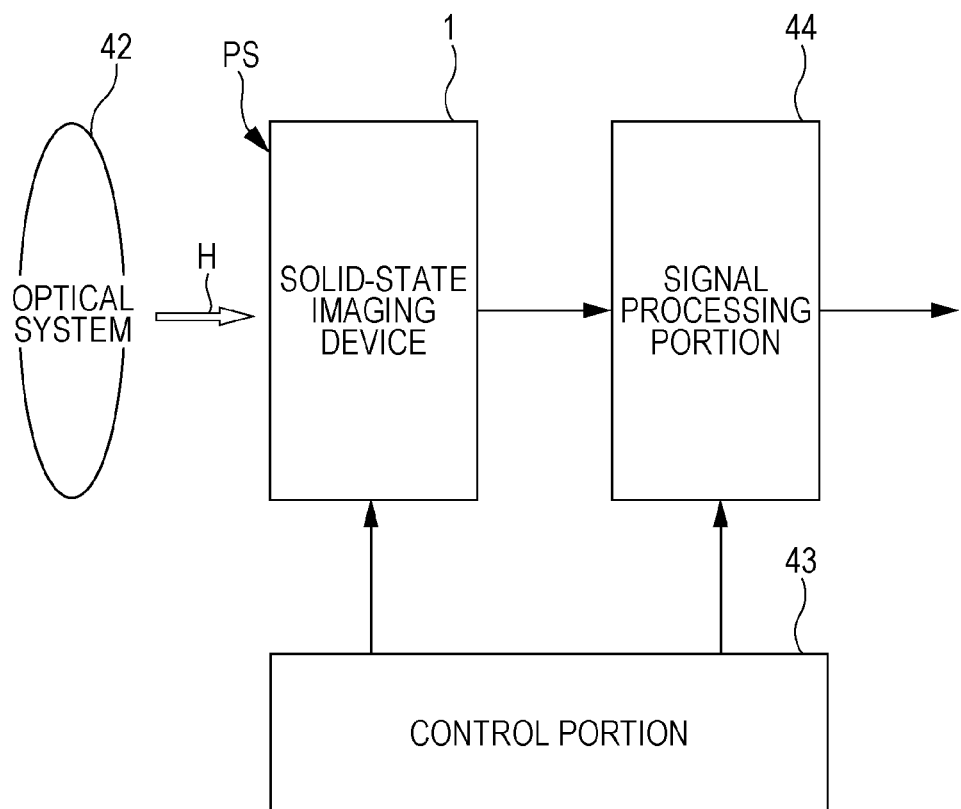
FIG. 1 is a configuration diagram illustrating a configuration of a camera in a first embodiment of the present disclosure.

As illustrated in FIG. 1, the camera 40 includes a solid-state imaging device 1, an optical system 42, a control portion 43, and a signal processing portion 44. Each portion will be sequentially described.

The solid-state imaging device 1 receives incident light H, which enters as a subject image via the optical system 42, through an imaging surface PS, performs a photoelectric conversion with respect to the received light, and generates a signal charge. Here, the solid-state imaging device 1 reads the signal charge by being driven based on a control signal output from the control portion 43, and outputs an electric signal.

The optical system 42 includes optical members such as an imaging lens or an aperture and is disposed so as to focus the incident light H on the imaging surface PS of the solid-state imaging device 1.

The control portion 43 outputs various control signals to the solid-state imaging device 1 and the signal processing portion 44, and controls and drives the solid-state imaging device 1 and the signal processing portion 44.

The signal processing portion 44 is configured so as to generate a digital image with respect to the subject image by performing a signal processing while having the electric signal output from the solid-state imaging device 1 as a raw data.

(A-2) Main Portion Configuration of Solid-State Imaging Device

The entire configuration of the solid-state imaging device 1 will be described.

Figure 2:
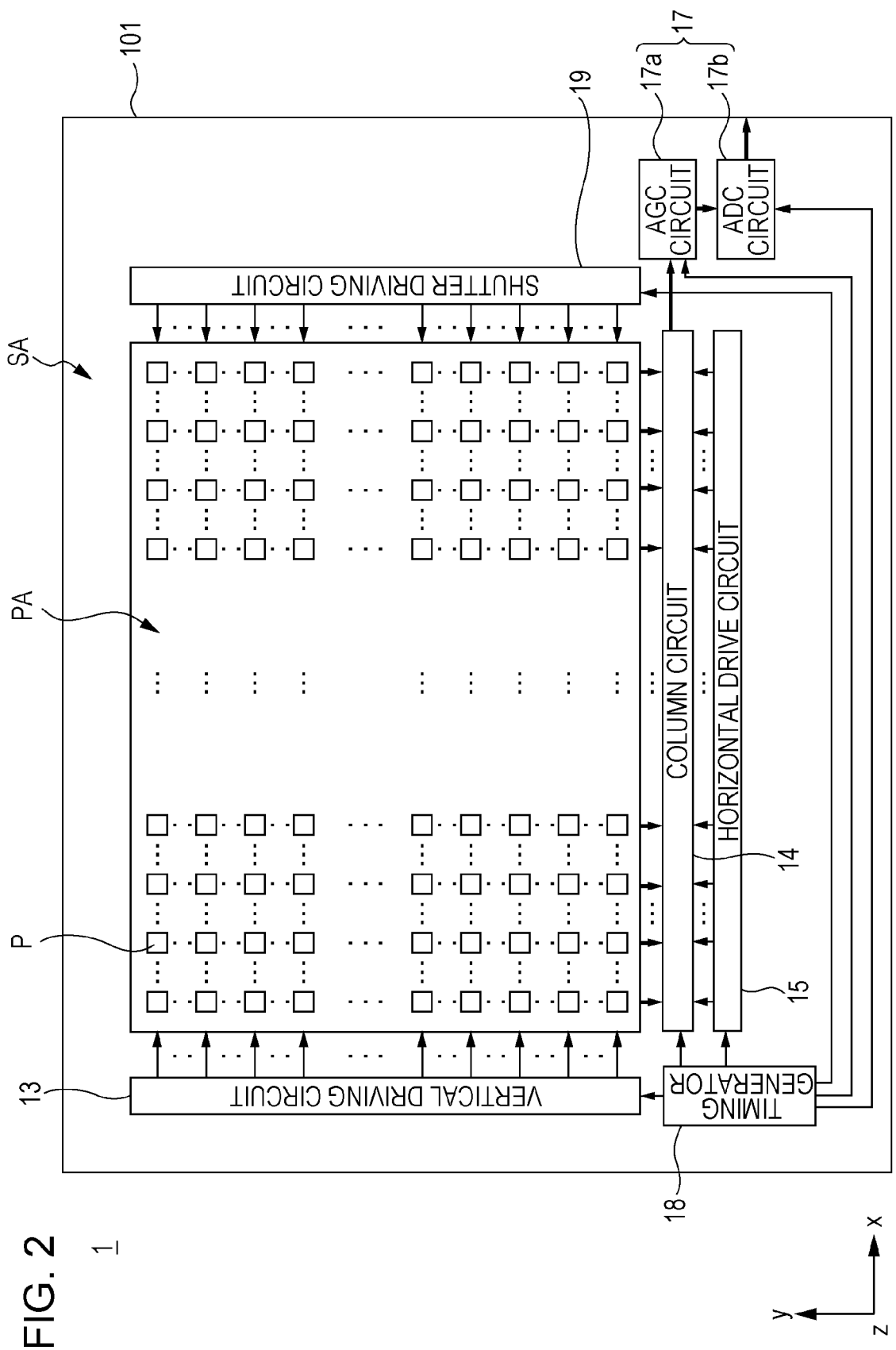
FIG. 2 is a diagram illustrating the entire configuration of a solid-state imaging device in the first embodiment of the present disclosure.

FIG. 2 is a diagram illustrating the entire configuration of a solid-state imaging device 1 in a first embodiment of the present disclosure.

The solid-state imaging device 1 of the present embodiment is a CMOS type image sensor and includes a semiconductor substrate 101 as illustrated in FIG. 2. For example, the semiconductor substrate 101 may be formed by thinning a single crystal silicon semiconductor substrate, and a pixel region PA and a peripheral region SA are provided on the surface of the semiconductor substrate.

As illustrated in FIG. 2, the pixel region PA is a rectangular shape, and a plurality of pixels P are disposed in each of a horizontal direction x and a vertical direction y. That is, the pixels P are lined up with a matrix form.

In the pixel region PA, the pixels P are configured so as to receive the incident light and generate the signal charge. Moreover, the generated signal charge is read by a pixel transistor (not illustrated) and output as an electric signal. The detailed configuration of the pixels P will be described hereinafter.

As illustrated in FIG. 2, the peripheral region SA is positioned in the periphery of the pixel region PA. Moreover, a peripheral circuit is provided in the peripheral region SA.

Specifically, as illustrated in FIG. 2, a vertical drive circuit 13, a column circuit 14, a horizontal drive circuit 15, an external output circuit 17, a timing generator (TG) 18, and a shutter drive circuit 19 are provided as the peripheral circuit.

As illustrated in FIG. 2, the vertical drive circuit 13 is provided at the side portion of the pixel region PA in the peripheral region SA, and the vertical drive circuit is configured so as to select and drive the pixels P of the pixel region PA by a row unit.

As illustrated in FIG. 2, the column circuit 14 is provided at the lower end of the pixel region PA in the peripheral region SA, and performs a signal processing with respect to the signal which is output from the pixels P by a column unit. Here, the column circuit 14 includes a CDS (Correlated Double Sampling) circuit (not illustrated) and performs a signal processing which removes a fixed pattern noise.

As illustrated in FIG. 2, the horizontal drive circuit 15 is electrically connected to the column circuit 14. For example, the horizontal drive circuit 15 includes a shift register, and sequentially outputs the signal, which is held for each column of the pixels P in the column circuit 14, to the external output circuit 17.

As illustrated in FIG. 2, the external output circuit 17 is electrically connected to the column circuit 14. In addition, after the external output circuit 17 performs a signal processing with respect to the signal output from the column circuit 14, the external output circuit outputs the processed signal to the external. The external output circuit 17 includes an AGC (Automatic Gain Control) circuit 17a and an ADC circuit 17b. In the external output circuit 17, after the AGC circuit 17a multiplies the signal by a gain, the ADC circuit 17b converts the analog signal to the digital signal and outputs the converted signal to the external.

As illustrated in FIG. 2, the timing generator 18 is electrically connected to the vertical drive circuit 13, the column circuit 14, the horizontal drive circuit 15, the external output circuit 17, and the shutter drive circuit 19 respectively. The timing generator 18 generates various timing signals, outputs the signals to the vertical drive circuit 13, the column circuit 14, the horizontal drive circuit 15, the external output circuit 17, and the shutter drive circuit 19. Therefore, the timing generator performs the driving control with respect to each portion.

The shutter drive circuit 19 is configured so as to select the pixels P by a row unit and adjust an exposure time in the pixels P.

(A-3) Detailed Configuration of Solid-State Imaging Device

The detailed contents of the solid-state imaging device according to the present embodiment are described.

Figure 3:
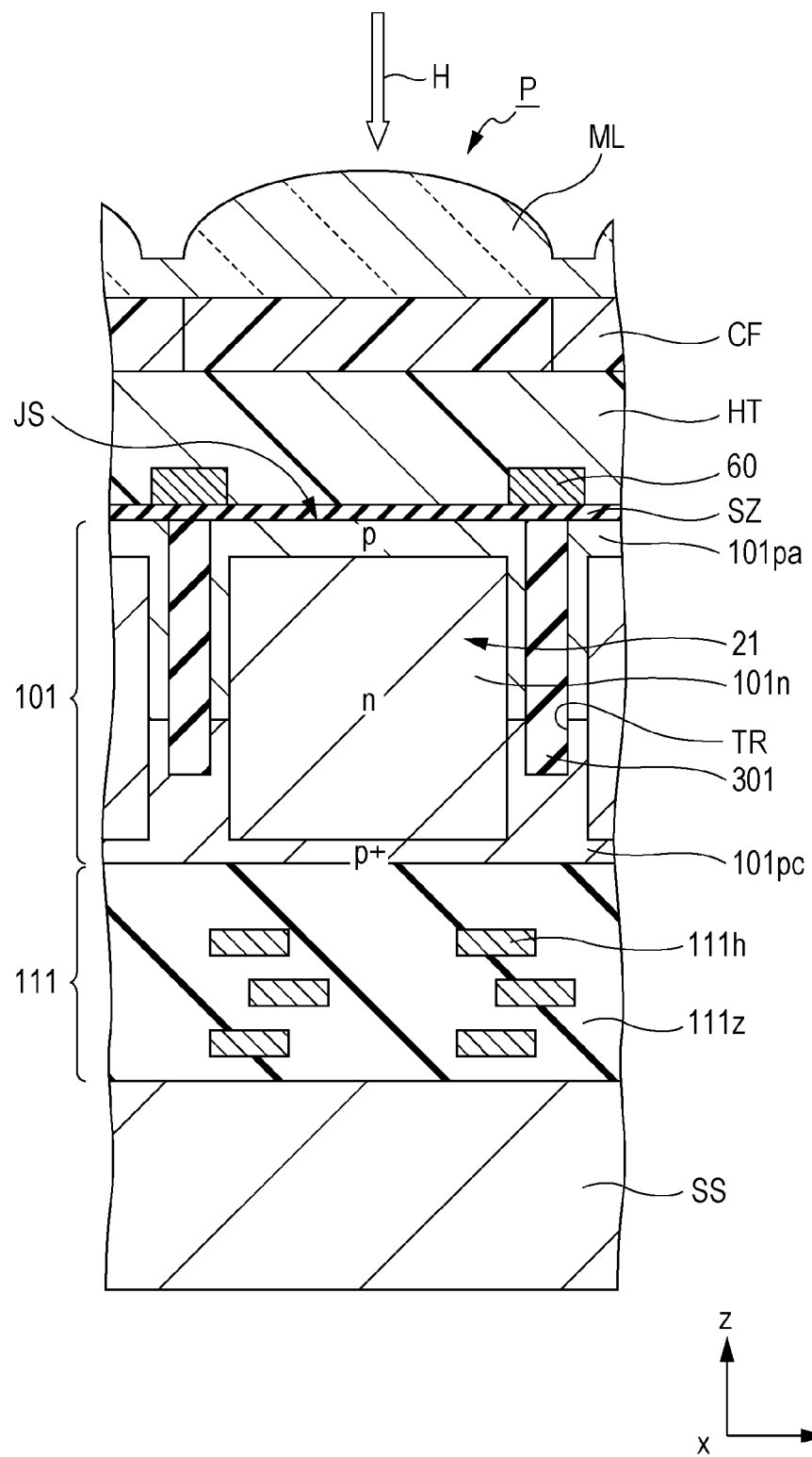
FIG. 3 is a diagram illustrating a main portion of the solid-state imaging device in the first embodiment of the present disclosure.
Figure 4:
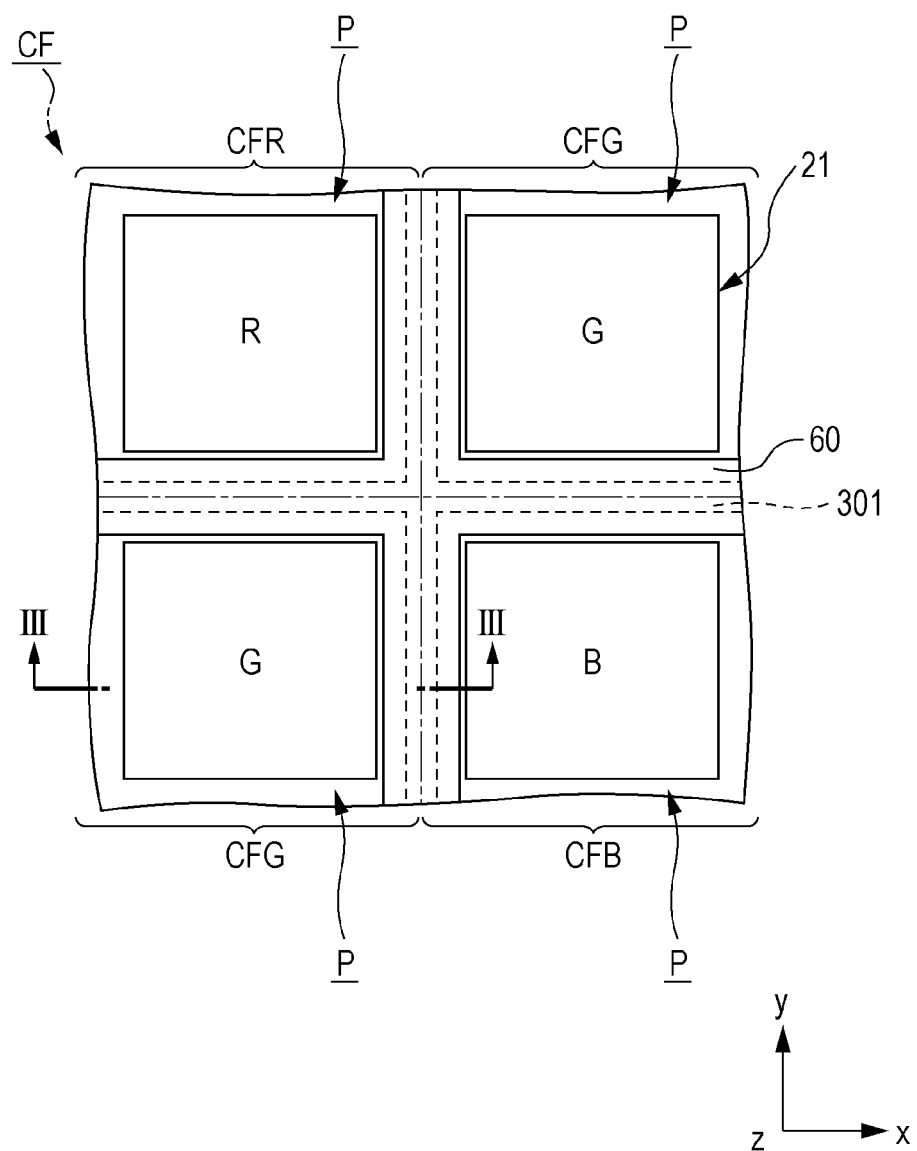
FIG. 4 is a diagram illustrating a main portion of the solid-state imaging device in the first embodiment of the present disclosure.
Figure 5:
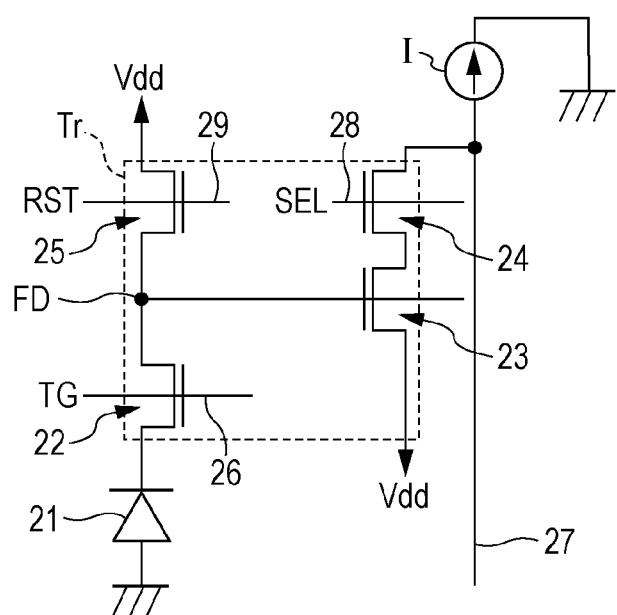
FIG. 5 is a diagram illustrating a main portion of the solid-state imaging device in the first embodiment of the present disclosure.

FIGS. 3 to 5 are diagrams illustrating a main portion of the solid-state imaging device in a first embodiment of the present disclosure.

FIG. 3 is a cross-sectional diagram of the pixel P. Moreover, FIG. 4 is a top view of the pixel P. In addition, FIG. 5 illustrates a circuit configuration of the pixel P. Moreover, FIG. 3 illustrates a cross-section taken along a line III-III illustrated in FIG. 4. Moreover, in FIG. 4, for convenience of description, in some cases, portions which illustrate each member are denoted by a broken line or the like other than a solid line.

As illustrated in FIG. 3, the solid-state imaging device 1 includes a photodiode 21 and a pixel separation portion 301 in the inner portion of the semiconductor substrate 101. For example, each portion is provided in the semiconductor substrate 101 of thinned single crystal silicon.

Members such as a light shielding film 60, a color filter CF, and a microlens ML are provided on a rear surface (upper surface in FIG. 3) of the semiconductor substrate 101.

In contrast, although not illustrated in FIG. 3, a pixel transistor Tr illustrated in FIG. 5 is provided on the front surface (lower surface in FIG. 3) of the semiconductor substrate 101. Moreover, as illustrated in FIG. 3, a wiring layer 111 is provided so as to cover the pixel transistor Tr. In addition, in the wiring layer 111, a supporting substrate SS is provided on the surface of the side opposite to the side of the semiconductor substrate 101.

That is, the solid-state imaging device 1 of the present embodiment is a "rear surface illumination type CMOS image sensor", and is configured so that the photodiode 21 receives the light H incident from the rear surface (upper surface) and generates a color image by imaging.

Details of each portion will be sequentially described.

(a) Photodiode 21

In the solid-state imaging device 1, a plurality of photodiodes 21 are disposed in the pixel region PA so as to correspond to the plurality of pixels P illustrated in FIG. 2. That is, the plurality of photodiodes 21 are provided so as to be lined up in each of a horizontal direction x and a vertical direction y perpendicular to the horizontal direction x in an imaging surface (xy plan).

The photodiode 21 is configured so as to generate signal charge by receiving the incident light H and performing a photoelectric conversion of the received light and accumulate the generated signal charge.

Here, as illustrated in FIG. 3, the photodiode 21 receives the light H incident from the rear surface (upper surface in FIG. 3) side of the semiconductor substrate 101. As illustrated in FIG. 3, a planarized film HT, a color filter CF, and a microlens ML are provided above the photodiode 21, the incident light H, which enters sequentially via each portion, is received through a light sensing surface JS, and a photoelectric conversion of the received light is performed.

As illustrated in FIG. 3, for example, the photodiode 21 is provided in the semiconductor substrate 101 which is a single crystal silicon semiconductor.

For example, the photodiode 21 is formed as a charge accumulation region in which an n-type semiconductor region 101n accumulates a charge (electrons). In the photodiode 21, the n-type semiconductor region 101n is provided in the inner portion of p-type semiconductor regions 101pa and 101pc of the semiconductor substrate 101. Here, in the n-type semiconductor region 101n, the p-type semiconductor region 101pc, which has a higher impurity concentration than the rear surface (upper surface) side, is provided in the front surface (lower surface) side of the semiconductor substrate 101. That is, the photodiode 21 is an HAD structure, and the p-type semiconductor regions 101pa and 101pc are formed in each interface of the upper surface side and the lower surface side of the n-type semiconductor region 101n in order to suppress occurrence of a dark current.

As illustrated in FIG. 3, a pixel separation portion 301 which electrically separates the plurality of pixels P is provided in the inner portion of the semiconductor substrate 101, and photodiode 21 is provided in a region which is divided by the pixel separation portion 301. For example, as illustrated in FIG. 4, the pixel separation portion 301 is formed in a lattice shape so as to be interposed between the plurality of pixels P, and the photodiode 21 is formed in the region which is divided by the pixel separation portion 101pb.

In addition, as illustrated in FIG. 5, an anode is grounded to each photodiode 21, and each photodiode 21 is configured so that the accumulated signal charge (here, electrons) is read by a pixel transistor Tr and output to a vertical signal line 27 as an electric signal.

(b) Shielding Film 60

In the solid-state imaging device 1, as illustrated in FIG. 3, the light shielding film 60 is provided on the rear surface (upper surface in FIG. 3) side of the semiconductor substrate 101.

The light shielding film 60 shields a portion of the incident light H from above the semiconductor substrate 101 toward the rear surface of the semiconductor substrate 101.

As illustrated in FIG. 3, the light shielding film 60 is provided above the pixel separation portion 301 which is provided in the inner portion of the semiconductor substrate 101. Here, the light shielding film 60 is provided so as to be protruded in a convex shape via an insulating film SZ such as a silicon oxide film on the rear surface (upper surface) of the semiconductor substrate 101. In contrast, the light shielding film 60 is opened so as to be not provided above the photodiode 21 which is provided in the inner portion of the semiconductor substrate 101 so that the incident light H enters the photodiode 21.

That is, as illustrated in FIG. 4, the planar shape of the light shield film 60 is a lattice shape and includes an opening in which the incident light H passes through the light sensing surface.

The light shielding film 60 is formed of a light shielding material which shields light. For example, the light shielding film 60 is formed by sequentially laminating a titanium (Ti) film and a tungsten (W) film. Besides this, the light shielding film 60 may be formed by sequentially laminating a titanium nitride (TiN) film and a tungsten (W) film.

Moreover, as illustrated in FIG. 3, the light shielding film 60 is covered by a planarized film HT. The planarized film HT is formed by using an insulation material which transmits light.

(C) Color Filter CF

In the solid-state imaging device 1, as illustrated in FIG. 3, the color filter CF is provided on the upper surface of the planarized film HT in the rear surface (upper surface in FIG. 3) side of the semiconductor substrate 101.

As illustrated in FIG. 4, the color filter CF includes a red filter layer CFR, a green filter layer CFG, and a blue filter layer CFB. Each of the red filter layer CFR, the green filter layer CFG, and the blue filter layer CFB is disposed so as to be adjacent to one another; the layers are all provided so as to correspond to each of the plurality of pixels P.

Here, as illustrated in FIG. 4, each of the red filter layer CFR, the green filter layer CFG, and the blue filter layer CFB is disposed so as to be lined up in a Bayer array. That is, a plurality of green filters CFG are disposed so as to be lined up in the diagonal direction to be a checked pattern. Moreover, the red filter layer CFR and the blue filter layer CFB are disposed so as to be lined up in the diagonal direction in the plurality of green filter layers CFG.

Specifically, the red filter layer CFR is formed so as to have a higher light transmissivity in a wavelength band (for example, 625 to 740 nm) corresponding to red, and to color the incident light H red and transmit the colored light to the sensing surface JS.

Moreover, the green filer filter layer CFG has a higher light transmissivity in a wavelength band (for example, 500 to 565 nm) corresponding to green. That is, the green filter layer CFG is formed so as to have a higher light transmissivity with respect to the light of the wavelength range of the shorter wavelength than the wavelength having the higher light transmissivity in the red filter layer CFR, and to color the incident light H green and transmit the colored light to the light sensing surface JS.

In addition, the blue filer filter layer CFB has a higher light transmissivity in a wavelength band (for example, 450 to 485 nm) corresponding to blue. That is, the blue filter layer CFB is formed so as to have a higher light transmissivity with respect to the light of the wavelength range of the shorter wavelength than the wavelength having the higher light transmissivity in the green filter layer CFG, and to color the incident light blue and transmit the colored light to the light sensing surface JS.

(d) Microlens ML

In the solid-state imaging device 1, as illustrated in FIG. 3, the microlens ML is provided on the upper surface of the color filter CF in the rear surface (upper surface in FIG. 3) side of the semiconductor substrate 101.

A plurality of microlenses ML are disposed so as to correspond to each pixel P. The microlens ML is a convex lens which is protruded in a convex shape in the rear surface side of the semiconductor substrate 101, and is configured so as to focus the incident light H to the photodiode 21 of each pixel P. For example, the microlens ML is formed by using an organic material such as a resin.

(e) Pixel Separation Portion 301

In the solid-state imaging device 1, as illustrated in FIGS. 3 and 4, the pixel separation portion 301 is formed by an insulation material so as to divide between the plurality of pixels P and electrically separates the plurality of pixels P.

As illustrated in FIG. 3, the pixel separation portion 301 is formed so as to be embedded to the inner portion of the semiconductor substrate 101 in the rear surface (upper surface in FIG. 3) side of the semiconductor substrate 101.

Specifically, the p-type impurity regions 101$pa$ and 101$pc$ are provided between the n-type impurity regions 101$n$ which configure the charge accumulation region of the photodiode 21 between the plurality of pixels P. Moreover, a trench TR is formed on the rear surface (upper surface) side of the p-type impurity regions 101$pa$ and 101$pc$, and the pixel separation portion 301 is provided in the inner portion of the trench TR.

As illustrated in FIG. 4, the planar shape of the pixel separation portion 301 is a lattice shape and interposed between the plurality of pixels P. In addition, the photodiode 21 is formed in the rectangular region which is divided by the lattice shaped pixel separation portion 101$pb$.

Here, the pixel separation portion 301 is formed by an insulation material which absorbs the light which enters the light sensing surface JS. The pixel separation portion 301 is formed so as to selectively absorb the light having at least some wavelength ranges in light having a plurality of different wavelength ranges which enters the light sensing surface JS via the color filter CF.

In the present embodiment, the pixel separation portion 301 is formed so as to at least selectively absorb the light having the wavelength range of the shortest wavelength in light having a plurality of different wavelength ranges which enters the light sensing surface JS via the color filter CF.

Specifically, among the colored light which is transmitted by the red filter layer CFR, the green filter layer CFG, and the blue filter layer CFB, when the blue light having the wavelength range of the shortest wavelength enters the pixel separation portion 301, the pixel separation portion 301 is formed so as to selectively absorb the blue light. That is, in the solid-state imaging device 1, the pixel separation portion 301 selectively absorbs the short wavelength light which is absorbed in the vicinity of the rear surface of the semiconductor substrate 101 and in which the "color mixing" is significantly generated.

Moreover, the pixel separation portion 301 is formed of a material which has a refractive index different from that of the semiconductor substrate 101.

For example, the pixel separation portion 301 is formed by forming a silicon nitride film (SiN) through an ALD (Atomic Layer Deposition) method. Thereby, the pixel separation portion 301 can selectively absorb the blue light. In addition, since the refractive index of the pixel separation portion 301 is different from that of the semiconductor substrate 101, the incident light H is reflected at the interface between the pixel separation portion 301 and the semiconductor substrate 101. Moreover, the light reflected at the interface enters the photodiode 21 again and the photoelectric conversion of the light is performed.

In addition, as illustrated in FIG. 3, the light shielding film 60 is provided above the pixel separation portion 301 via the insulating film SZ. Here, as illustrated in FIG. 4, similarly to the pixel separation portion 301, the planar shape of the light shielding film 60 is formed so as to be a lattice shape.

(f) Pixel Transistor Tr

In the solid-state imaging device 1, a plurality of pixel transistors Tr are disposed so as to correspond to the plurality of pixels illustrated in FIG. 2.

As illustrated in FIG. 5, the pixel transistor Tr includes a transfer transistor 22, an amplifying transistor 23, a selection transistor 24, and a reset transistor 25, and reads the signal charge from the photodiode 21 and outputs the read signal charge as an electric signal.

Although not illustrated in FIG. 3, each of the transistors 22 to 25 which configure the pixel transistor Tr is provided on the front surface on which the wiring layer 111 is provided in the semiconductor substrate 101. For example, each of the transistors 22 to 25 is an N channel MOS transistor, and for example, each gate is formed by using polysilicon. Moreover, each of the transistors 22 to 25 is covered by the wiring layer 111.

In the pixel transistor Tr, as illustrated in FIG. 5, the transfer transistor 22 is configured so as to transfer the signal charge, which is generated by the photodiode 21, to a floating diffusion FD. Specifically, as illustrated in FIG. 5, the transfer transistor 22 is provided between a cathode of the photodiode 21 and the floating diffusion FD. In addition, the gate of the transfer transistor 22 is electrically connected to the transfer line 26. The transfer transistor 22 transfers the signal charge, which is accumulated in the photodiode 21, to the floating diffusion FD based on a transfer signal TG which is sent from the transfer line 26 to the gate.

In the pixel transistor Tr, as illustrated in FIG. 5, the amplifying transistor 23 is configured so as to amplify the electric signal converted from the charge to the voltage in the floating diffusion FD and output the amplified electric signal. Specifically, as illustrated in FIG. 5, the gate of the amplifying transistor 23 is electrically connected to the floating diffusion FD. Moreover, the drain of the amplifying transistor 23 is electrically connected to a power supply line Vdd, and the source of the amplifying transistor is electrically connected to the selection transistor 24. When the selection transistor 24 is selected so as to be turned on, a constant current is supplied to the amplifying transistor 23 from a constant current source I, and the amplifying transistor is operated as a source follower. Therefore, due to the fact that the selection signal is supplied to the selection transistor 24, the electric signal, which is converted from the charge to the voltage in the floating diffusion FD, is amplified in the amplifying transistor 23.

In the pixel transistor Tr, as illustrated in FIG. 5, the selection transistor 24 is configured so as to output the electric signal, which is output by the amplifying transistor 23, to the vertical signal line 27 based on the selection signal. Specifically, as illustrated in FIG. 5, the gate of the selection transistor 24 is connected to an address line 28 to which the selection signal is supplied. Moreover, the selection transistor 24 is turned on when the selection signal is supplied, and as described above, the selection transistor 24 outputs the output signal, which is amplified by the amplifying transistor 23, to the vertical signal line 27.

In the pixel transistor Tr, as illustrated in FIG. 5, the reset transistor 25 is configured so as to reset the gate potential of the amplifying transistor 23. Specifically, as illustrated in FIG. 5, the gate of the reset transistor 25 is electrically connected to a reset line 29 to which the reset signal is supplied. Moreover, the drain of the reset transistor 25 is electrically connected to the power supply line Vdd, and the source of the reset transistor is electrically connected to the floating diffusion FD. In addition, the reset transistor 25 resets the gate potential of the amplifying transistor 23 to a power supply voltage via the floating diffusion FD based on the reset signal which is sent from the reset line 29.

Figure 6:
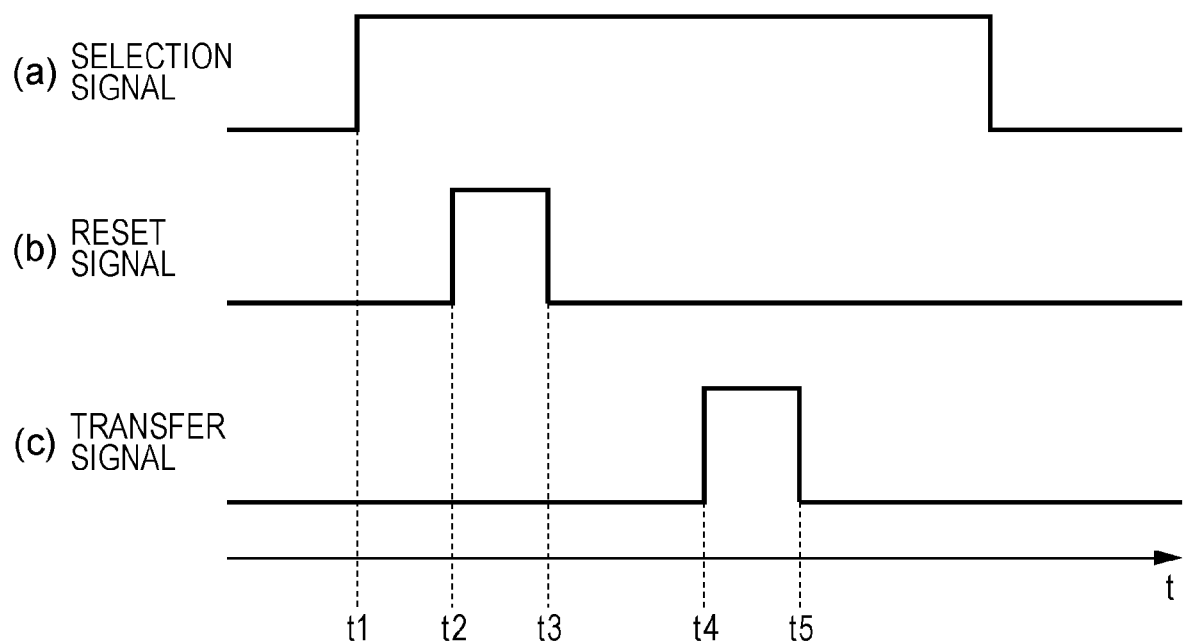
FIG. 6 is a timing chart illustrating a control signal which is sent to a pixel transistor Tr of a pixel P when performing an imaging in the first embodiment of the present disclosure.

FIG. 6 is a timing chart illustrating a control signal which is sent to the pixel transistor Tr of the pixel P when imaging is performed in the first embodiment of the present disclosure.

In FIG. 6, (a) illustrates a selection signal SEL which is input to the gate of the selection transistor 24. Moreover, (b) illustrates a reset signal RST which is input to the gate of the reset transistor 25. In addition, (c) illustrates a transfer signal TG which is input to the gate of the transfer transistor 22 (refer to FIG. 5).

As illustrated in FIG. 6, when the imaging is performed, in a first time point t1, the selection transistor 24 is turned on while the selection signal SEL is set to a high level. Moreover, in a second time point t2, the reset transistor 25 is turned on while the reset signal RST is set to a high level. Thereby, the gate potential of the amplifying transistor 23 is reset (refer to FIG. 5).

In addition, as illustrated in FIG. 6, in a third time point t3, the reset transistor 25 is turned off while the reset signal RST is set to a low level. Moreover, thereafter, the voltage corresponding to the reset level is read to the column circuit as an output signal 14 (refer to FIGS. 2 and 5).

In addition, as illustrated in FIG. 6, in a fourth time point t4, the transfer transistor 22 is turned on while the transfer signal TG is set to a high level. Thereby, the signal charge which is accumulated by the photodiode 21 is transferred to the floating diffusion FD (refer to FIG. 5).

In addition, as illustrated in FIG. 6, in a fifth time point t5, the transfer transistor 22 is turned off while the transfer signal TG is set to a low level. Thereafter, the voltage of the signal level corresponding to the amount of the accumulated signal charge is read to the column circuit 4 as an output signal (refer to FIGS. 2 and 5).

In the column circuit 14, a differential processing between the signal of the previously read reset level and the signal of the latterly read signal level is preformed and the processed signal is accumulated (refer to FIGS. 2 and 5).

Thereby, a fixed pattern noise, which is generated by variations or the like of Vth in each transistor provided for each pixel P, is cancelled out.

Since each gate of the transistors 22, 24, and 25 is connected by a row unit which includes a plurality of pixels P lined up in a horizontal direction x, the operation driving the pixel P as described above is simultaneously performed with respect to the plurality of pixels P which is lined up by the row unit.

Specifically, the pixels are sequentially selected in the perpendicular direction by the horizontal line (pixel row) unit through the selection signal which is supplied by the above-described vertical drive circuit 13. In addition, the transistors of each pixel P are controlled by various timing signals which are output from the timing generator 18. Therefore, the signals of each pixel are read to the column circuit 14 for each column of the pixels P through the vertical signal line 27 (refer to FIGS. 2 and 5).

Moreover, the signals accumulated by the column circuit 14 are selected by the horizontal drive circuit 15 and sequentially output to the external output circuit 17 (refer to FIGS. 2 and 5).

In addition, the signal processing portion 44 performs the signal processing while having the signals obtained by the imaging as raw data and generates a digital image (refer to FIG. 1).

(g) Wiring Layer 111

In the solid-state imaging device 1, as illustrated in FIG. 3, the wiring layer 111 is provided on the front surface (lower surface) of the side opposite to the rear surface (upper surface) on which each portion such as the light shielding film 60, the color filter CF, and the microlens ML is provided in the semiconductor substrate 101.

The wiring layer 111 includes wirings 111h and the insulating layer 111z and is configured so that the wirings 111h are electrically connected to each element in the insulating layer 111z. The wiring layer 111 is a so-called multilayer wiring and formed by laminating alternatively interlayer insulating films configuring the insulating layer 111z and wirings 111h a plurality of times. Here, a plurality of wirings 111h are formed to be laminated via the insulation layer 111z so as to function as each wiring of the transfer line 26, the address line 28, the vertical signal line 27, the reset line 29, or the like illustrated in FIG. 5.

Moreover, in the wiring layer 111, the supporting substrate SS is provided on the surface of the side opposite to the side on which the semiconductor substrate 101 is positioned. For example, a substrate which includes a silicon semiconductor having a thickness of several hundred μm is provided as the supporting substrate SS.

(B) Manufacturing Method

Main portions of a method for manufacturing the above-described solid-state imaging device 1 will be described.

FIGS. 7 to 13 are diagrams illustrating the method of manufacturing the solid-state imaging device in the first embodiment of the present disclosure.

Similarly to FIG. 3, each drawing is illustrated in a cross-section, and the solid-state imaging device 1 illustrated in FIG. 3 or the like is manufactured sequentially through processes illustrated in each drawing.

(a) Formation of Photodiode 21 or the Like

Figure 7:
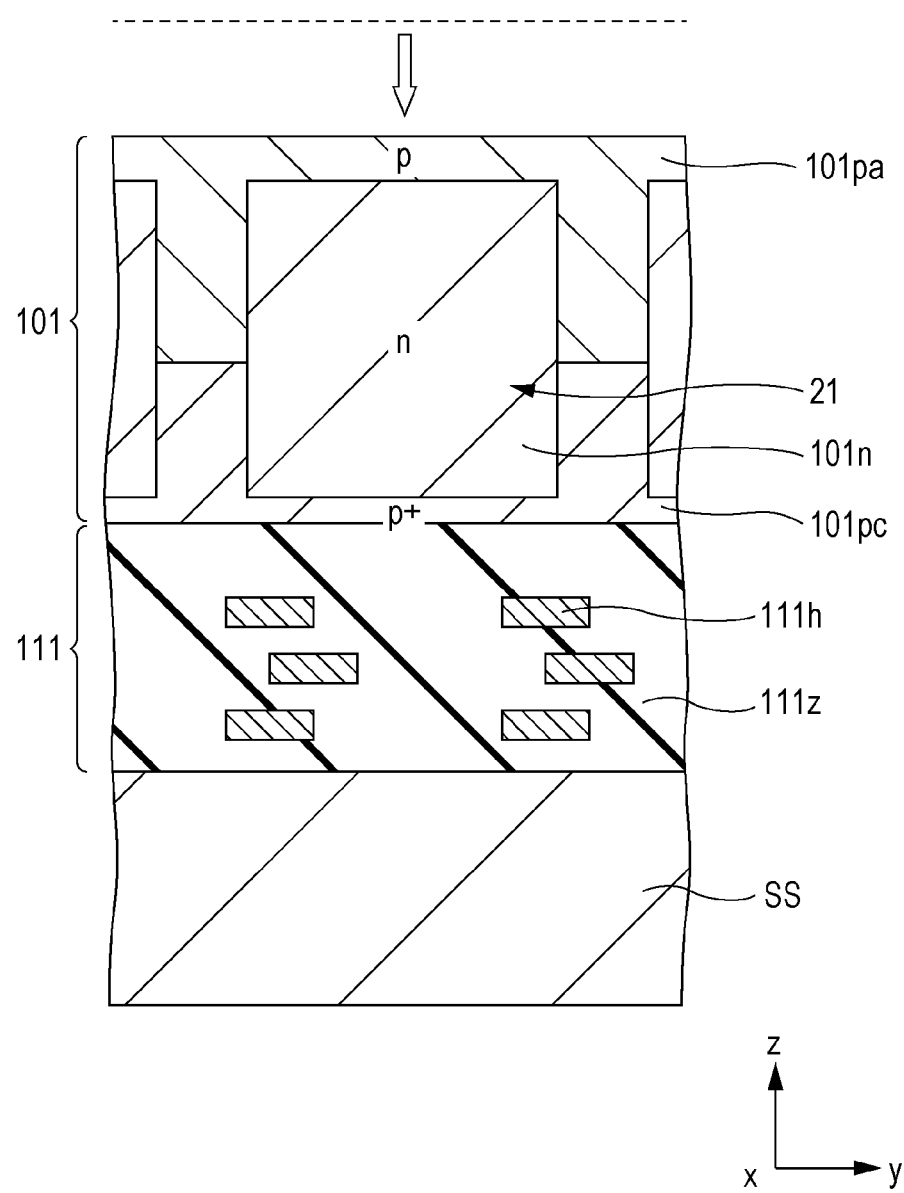
FIG. 7 is a diagram illustrating a method of manufacturing the solid-state imaging device in the first embodiment of the present disclosure.

First, as illustrated in FIG. 7, formation of the photodiode 21 or the like is performed.

Here, the photodiode 21 is formed by ion-implanting impurities from the front surface of the semiconductor substrate 101 including a single crystal silicon semiconductor. Moreover, after the pixel transistor Tr (not illustrated in FIG. 7) is formed on the front surface of the semiconductor substrate 101, the wiring layer 111 is formed so as to cover the pixel transistor Tr. In addition, the supporting substrate SS is bonded to the front surface of the wiring layer 111.

Thereafter, for example, the semiconductor substrate 101 is thinned so as to have a thickness of about 10 to 20 μm. For example, the thinning is performed by grinding the substrate through a CMP method.

Moreover, the photodiode 21 and the pixel transistor Tr are formed on a semiconductor layer of a SOI substrate (not illustrated), similarly to the above-described one; after the wiring layer 111 and the supporting substrate SS are provided, the thinning treatment may be performed.

(b) Formation of Trench TR

Figure 8:
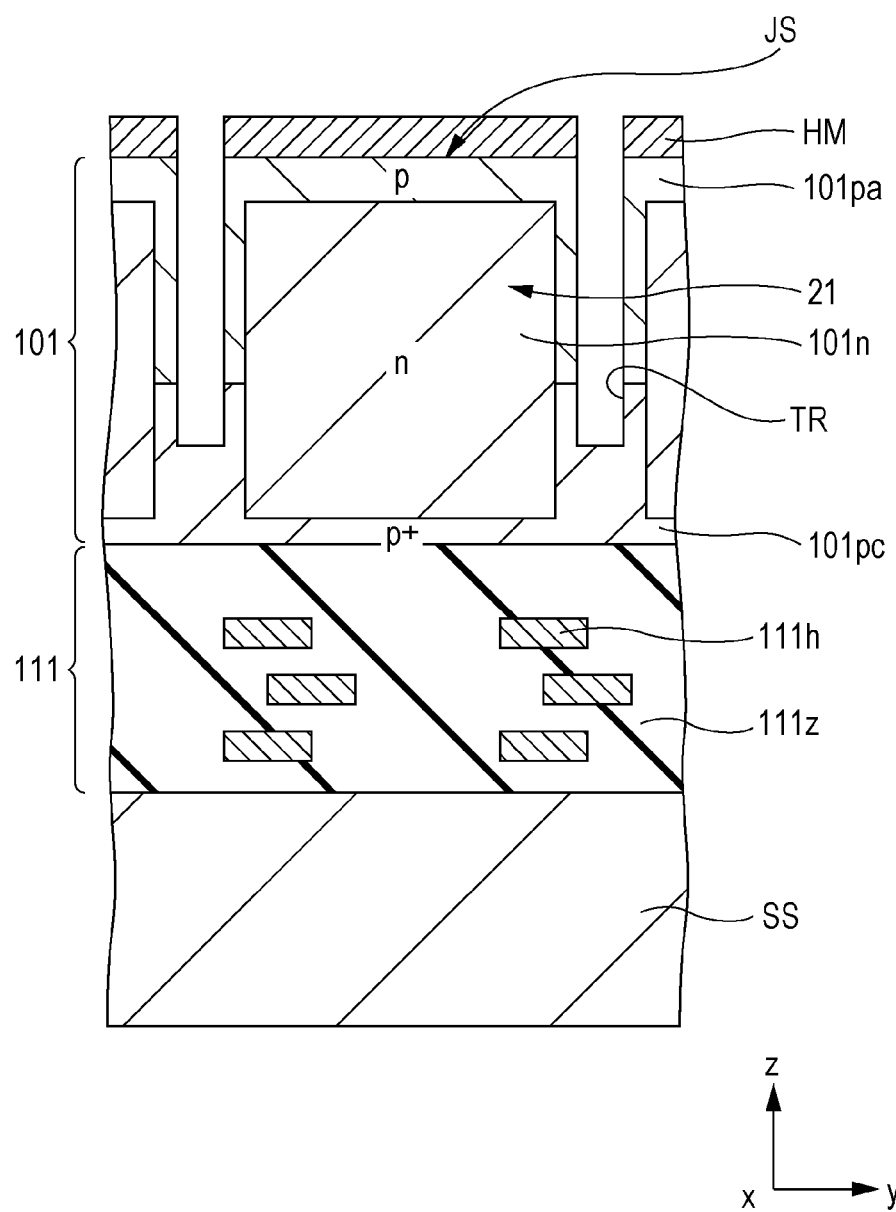
FIG. 8 is a diagram illustrating a method of manufacturing the solid-state imaging device in the first embodiment of the present disclosure.

Next, as illustrated in FIG. 8, the trench TR is formed.

Here, the trench TR is formed at a portion which forms the pixel separation portion 301 (refer to FIG. 3) in the semiconductor substrate 101.

Specifically, as illustrated in FIG. 8, after a hard mask HM is pattern-processed on the rear surface (upper surface) of the semiconductor substrate 101, the trench TR is formed by performing the pattern-processing with respect to the semiconductor substrate 101 by using the hard mask HM. For example, the trench TR is formed so as to have a depth of 0.3 to 3.0 μm by performing an etching processing of the semiconductor substrate 101 by using a sheet-type dry etching apparatus.

(c) Removal of Hard Mask HM

Figure 9:
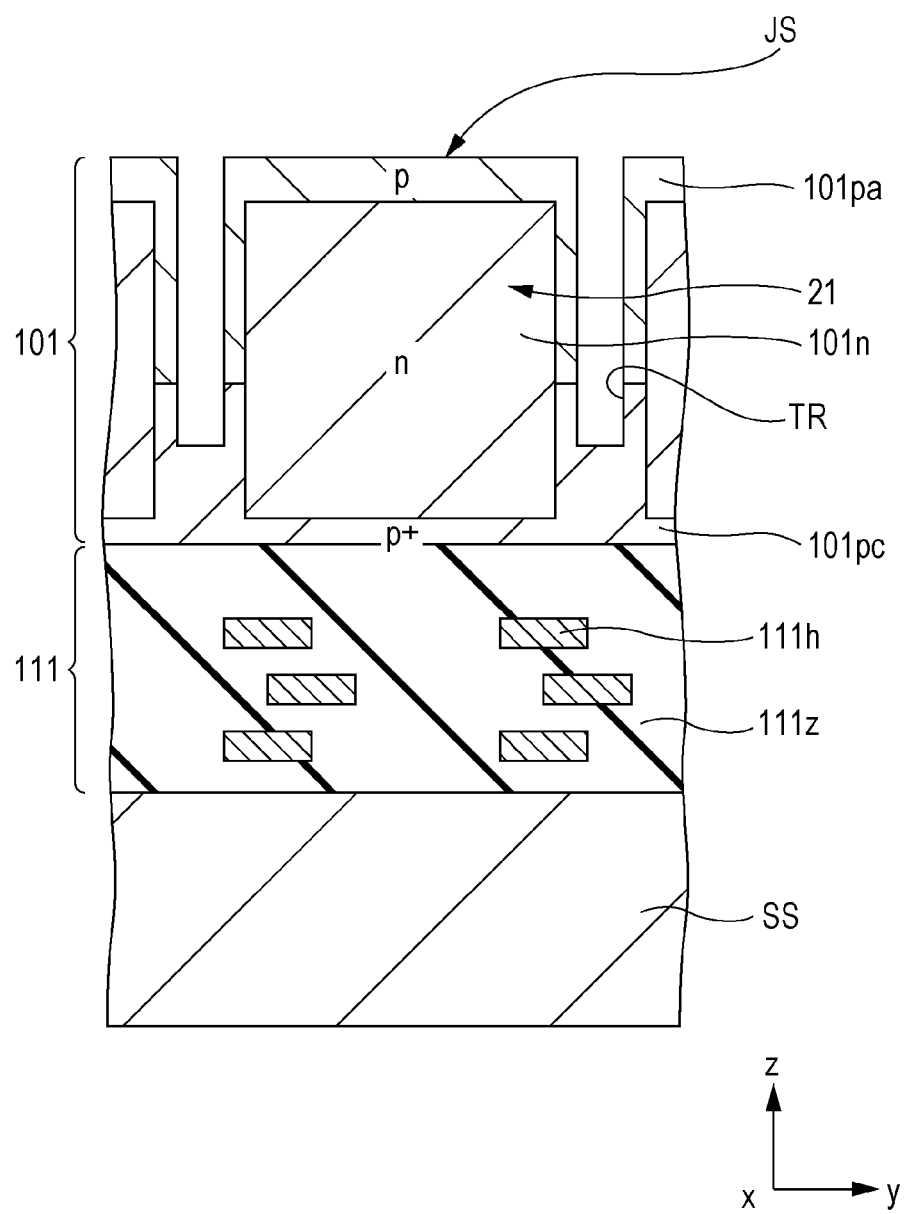
FIG. 9 is a diagram illustrating a method of manufacturing the solid-state imaging device in the first embodiment of the present disclosure.

Next, as illustrated in FIG. 9, the hard mask HM is removed.

Here, for example, the hard mask HM is removed from the rear surface (upper surface) of the semiconductor substrate 101 by performing an etching processing with respect to the hard mask HM. Thereby, the rear surface (upper surface) of the semiconductor substrate 101 is exposed.

(d) Formation of Light Absorption Insulating Film 401

Figure 10:
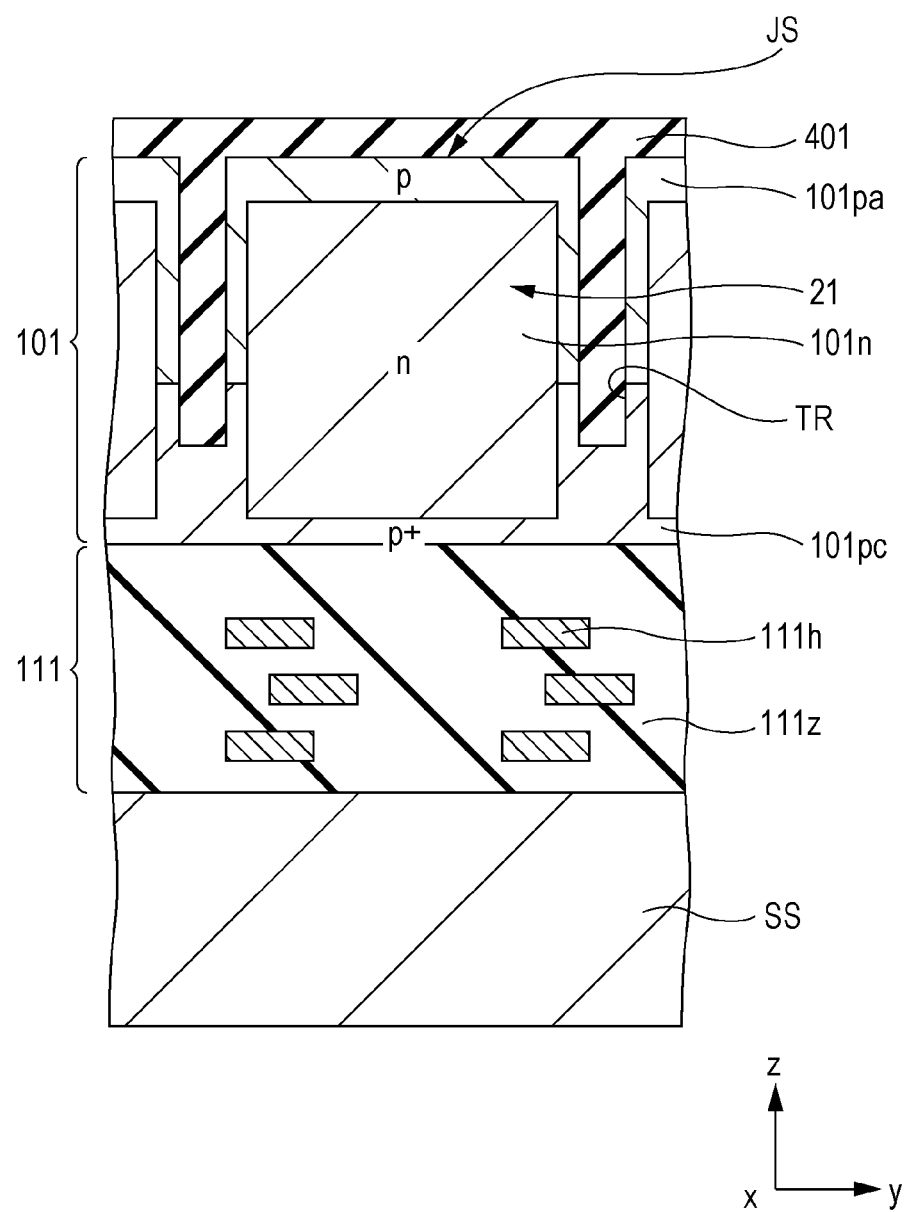
FIG. 10 is a diagram illustrating a method of manufacturing the solid-state imaging device in the first embodiment of the present disclosure.

Next, as illustrated in FIG. 10, a light absorption insulating film 401 is formed.

Here, in order to bury the inner portion of the trench TR which is formed in the semiconductor substrate 101, the light absorption insulating film 401 is formed by forming the film of an insulation material, which absorbs the light incident to the light sensing surface JS, on the rear surface (upper surface) of the semiconductor substrate 101.

In the present embodiment, the light absorption insulation film 401 is formed by forming the film of the insulation material which selectively absorbs the light having the wavelength range of the shortest wavelength in the light having a plurality of different wavelength ranges which enters the light sensing surface JS via the color filter CF (refer to FIGS. 3 and 4). That is, the light absorption insulating film 401 is formed by forming the film of the insulation material which at least selectively absorbs the blue light having the shortest wavelength among colored light which is transmitted by the red filter layer CFR, the green filter layer CFG, and the blue filter layer CFB.

Specifically, the light absorption insulating film 401 is formed by forming a silicon nitride film (SiN) through an ALD method.

For example, the light absorption insulating film 401 is formed by forming the silicon nitride film (SiN) according to the following conditions.

$SiH_2Cl_2$ flow rate: 500 to 1500 sccm
$NH_3$ flow rate: 2000 to 4000 sccm
$N_2$ flow rate: 500 to 1000 sccm
RF Power: 100 to 500 W
Film Formation Temperature: 320 to 400° C.

(e) Formation of Pixel Separation Portion 301

Figure 11:
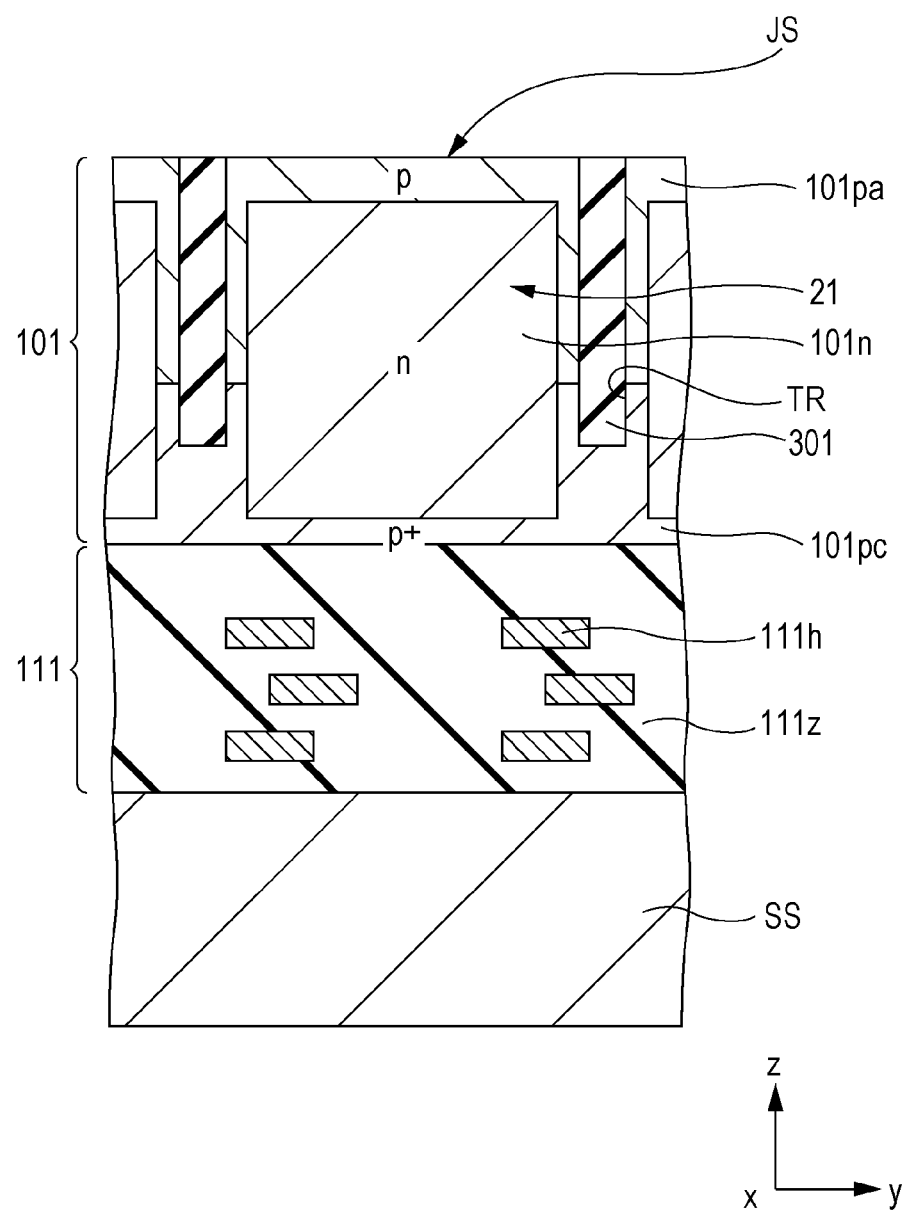
FIG. 11 is a diagram illustrating a method of manufacturing the solid-state imaging device in the first embodiment of the present disclosure.

Next, as illustrated in FIG. 11, the pixel separation portion 301 is formed.

Here, the pixel separation portion 301 is formed from the light absorption insulating film 401 by removing the upper surface portion of the light absorption insulating film 401 so as to expose the rear surface (upper surface) of the semiconductor substrate 101.

For example, the rear surface (upper surface) of the semiconductor substrate 101 is exposed by performing a dry etching processing with respect to the upper surface portion of the light absorption insulating film 401. Thereby, the pixel separation portion 301, which is embedded into the trench TR of the semiconductor substrate 101, is formed.

Besides this, the pixel separation portion 301 may be formed by performing a CMP processing with respect to the upper surface portion of the light absorption insulating film 401.

(f) Formation of Light Shielding Film 60

Figure 12:
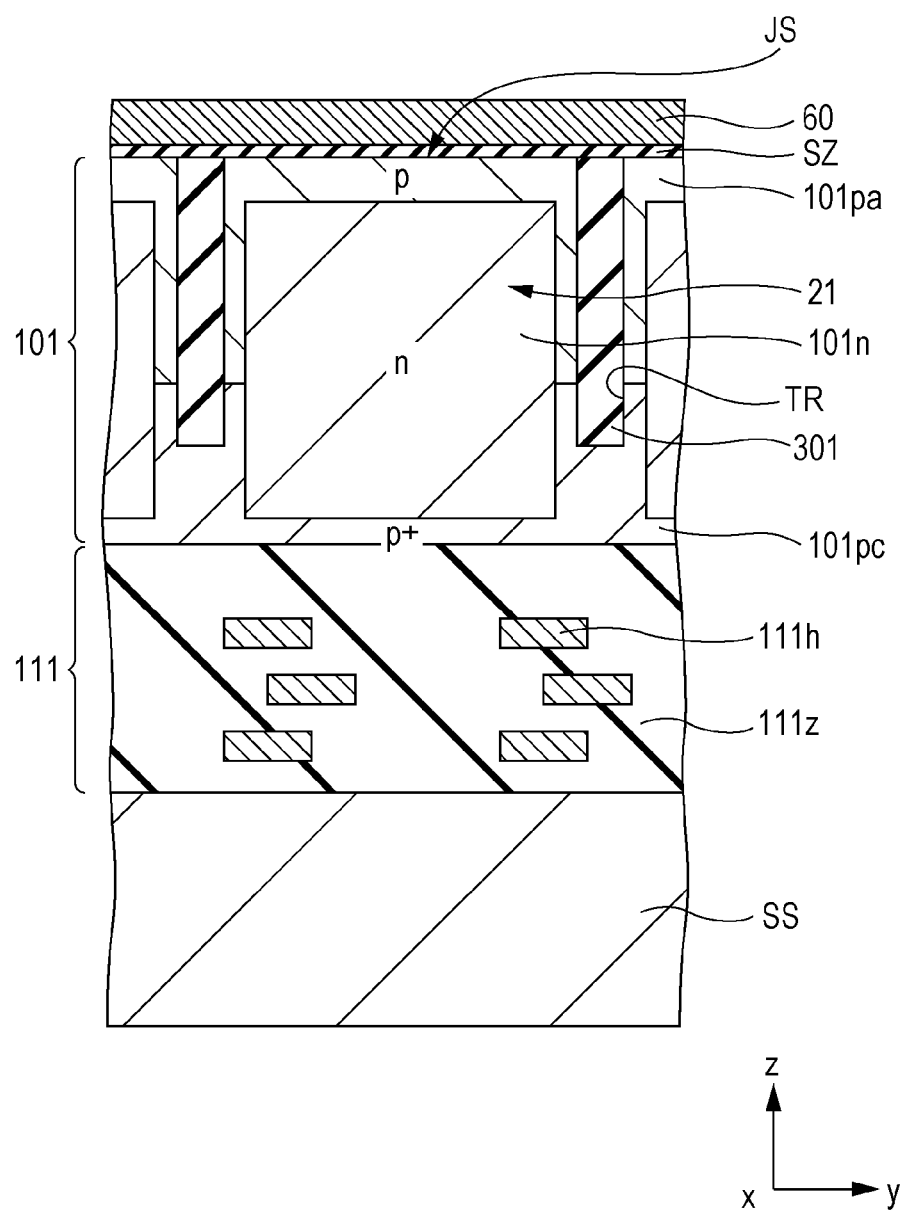
FIG. 12 is a diagram illustrating a method of manufacturing the solid-state imaging device in the first embodiment of the present disclosure.

Next, as illustrated in FIG. 12, the light shielding film 60 is formed.

Here, the light shielding film 60 is formed so as to cover the entire rear surface (upper surface) of the semiconductor substrate 101 via the insulating film SZ.

Specifically, the insulating film SZ is formed by forming the film of the insulation material on the entire rear surface (upper surface) of the semiconductor substrate 101. For example, the insulating film SZ is formed by forming a silicon oxide film so as to have a thickness of 100 to 500 nm.

Moreover, the light shielding film 60 is formed by forming the film of the light shielding material on the entire upper surface of the insulating film SZ. For example, the light shielding film 60 is formed by sequentially forming a titanium (Ti) film having the thickness of 10 to 50 nm and a tungsten (W) film having the thickness of 100 to 300 nm through a sputtering method.

(g) Pattern Processing of Light Shielding Film 60

Figure 13:
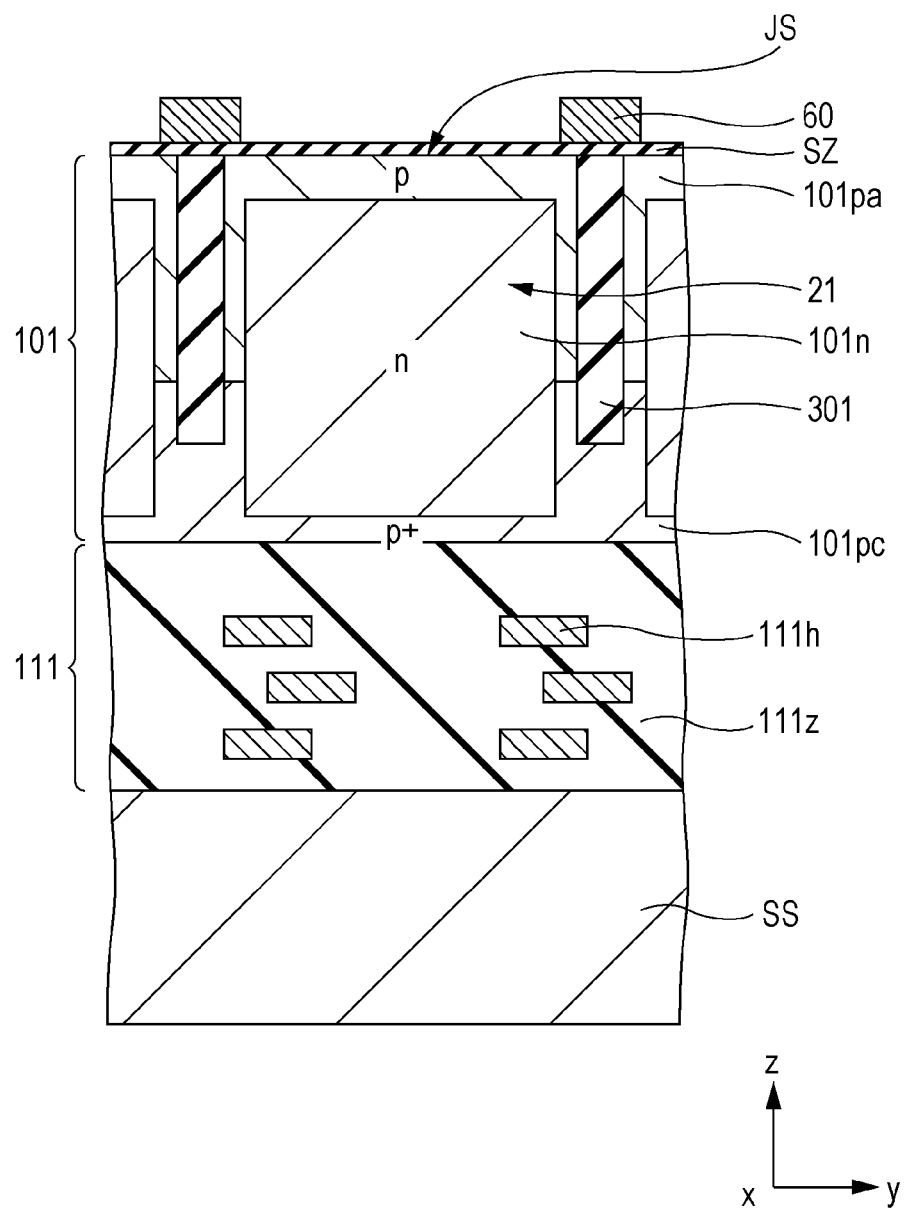
FIG. 13 is a diagram illustrating a method of manufacturing the solid-state imaging device in the first embodiment of the present disclosure.

Next, as illustrated in FIG. 13, the light shielding film 60 is pattern-processed.

Here, the light shielding film 60 is pattern-processed so as to be a pattern in which the upper portion of the pixel separation portion 301 is covered and the portion of the light sensing surface JS of the photodiode 21 is opened. That is, as illustrated in FIG. 4, the light shielding film 60 is processed so that the planar shape is a pattern of the lattice shape.

Specifically, the light shielding film 60 is processed by performing a dry etching processing.

(h) Formation of Planarized Film HT, Color Filter CF, and Microlens ML

Next, as illustrated in FIG. 3, each member of the planarized film HT, the color filter CF, and the microlens ML is formed.

Here, the planarized film HT is formed so as to evenly cover the rear surface (upper surface) of the semiconductor substrate 101 on which the light shielding film 60 is pattern-processed. For example, the planarized film HT is formed by performing a heat curing treatment after applying an acrylic based heat curable resin through a spin-coating method.

Moreover, as illustrated in FIG. 3, the color filter CF is formed on the upper surface of the planarized film HT.

For example, the color filter CF is formed by pattern-processing a coating film through a lithography technology after applying an application liquid including coloring matters such as pigments or dyes and photosensitive resins through a coating method such as the spin-coating method and forming the coating film.

Thereafter, as illustrated in FIG. 3, the microlens ML is provided on the upper surface of the color filter CF. For example, the microlens ML is formed by deforming the pattern-processed resin into a lens shape through a reflow treatment after pattern-processing a photosensitive resin film through a photolithography technology. Beside this, the microlens ML may be formed by performing an etch-back processing while having the resist pattern as a mask after forming a resist pattern of a lens shape on a lens material film.

In this way, the "rear surface illumination type" of CMOS image sensor is completed.

(C) Conclusion

As described above, in the present embodiment, the plurality of photodiodes 21 which receive the incident light H through the light sensing surface JS are provided so as to correspond to the plurality of pixels P in the inner portion of the semiconductor substrate 101 respectively. In addition, the pixel separation portion 301 which electrically separates the plurality of pixels P is embedded into the inner portion of the trench TR provided at the side portion of the photodiode 21 in the side of the rear surface (upper surface) into which the incident light H enters in the semiconductor substrate 101 (refer to FIG. 3).

The pixel transistor Tr, which outputs the signal charge generated by the photodiode 21 as the electric signal, is provided on the front surface (lower surface) of the side opposite to the rear surface (upper surface) into which the incident light H enters in the semiconductor substrate 101. In addition, the wiring layer 111 is provided so as to cover the pixel transistor Tr in the front surface of the semiconductor substrate 101 (refer to FIG. 3).

The color filter CF, which is transmitted by the incident light H to the light sensing surface JS, is provided on the side of the rear surface (upper surface) of the semiconductor substrate 101. Like the red filter layer CFR, the green filter layer CFG, and the blue filter layer CFB of the color filter CF, a plurality of kinds of filter layers having a higher transmissivity in light of wavelength ranges different to one another are disposed so as to be adjacent to one another corresponding to each of the plurality of pixels P (refer to FIG. 4).

Figure 27:
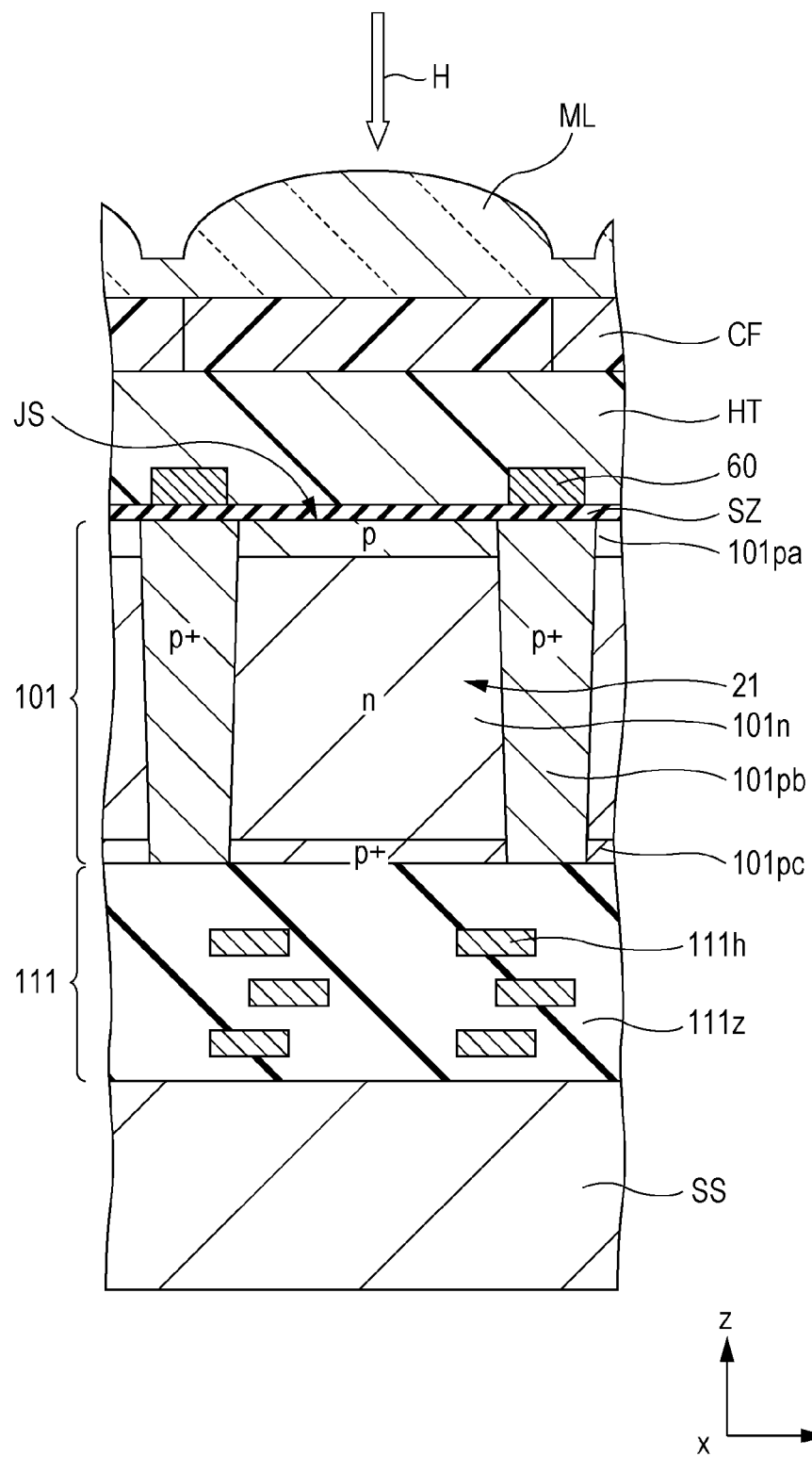
FIG. 27 is a cross-sectional diagram illustrating a main portion of a pixel P in a CMOS image sensor of "a rear surface illumination type".

In the case of the "rear surface illumination type", when the pixel separation portion 101pb is formed by ion-implanting the impurities from the front surface (lower surface) side of the semiconductor substrate 101 (refer to FIG. 27), the "color mixing" in the vicinity of the rear surface (upper surface) of the semiconductor substrate 101 is often generated. Particularly, the "color mixing" is often generated in the short wavelength light such as blue. In addition to this, the saturation charge accumulation amount (Qs) of the photodiode 21 is decreased, and a dynamic range may be deteriorated.

However, in the present embodiment, the pixel separation portion 301 is provided in the inner portion of the trench TR which is formed on the rear surface (upper surface) side in the semiconductor substrate 101. Here, the pixel separation portion 301 is formed by an insulation material which absorbs the light incident to the light sensing surface JS. Thereby, the separation between the pixels P can be realized with the narrower width at the deeper region from the rear surface, and the electric field in the vicinity of the rear surface can be strong.

In addition, in light having a plurality of wavelength ranges different to one another which enters the light sensing surface JS via each of the plurality of kinds of filter layers CFR, CFG, and CFB configuring the color filter CF, the pixel separation portion 301 is formed so as to selectively absorb the light having some wavelength ranges. Here, the pixel separation portion 301 is formed so as to at least selectively absorb the light having the wavelength range of the shortest wavelength among the plurality of different wavelength ranges in the plurality of kinds of filter layers CFR, CFG, and CFB. That is, in colored light which is transmitted by the red filter layer CFR, the green filter layer CFG, and the blue filter layer CFB, the pixel separation portion is formed so as to at least selectively absorb the blue light having the shortest wavelength.

Therefore, in the "rear surface illumination type" of the present embodiment, since the pixel separation portion 301 selectively absorbs the short wavelength light which is absorbed in the vicinity of the rear surface of the semiconductor substrate 101 and obviously generates the "color mixing", occurrence of the "color mixing" can be appropriately prevented. Moreover, since the saturation charge capacitance (saturation signal amount) (Qs) can be increased, a dynamic range can be improved. Particularly, the effect can be appropriately exhibited in the portion which receives blue color.

Moreover, in the present embodiment, the pixel separation portion 301 is formed by a material which has the refractive index different from that of the semiconductor substrate 101. Therefore, in the present embodiment, sensitivity can be improved.

Particularly, in the present embodiment, since the pixel separation portion 301 is formed by the silicon nitride film which is formed through an ALD method, the effect can be appropriately exhibited.

The effect will be described in detail.

Figure 14:
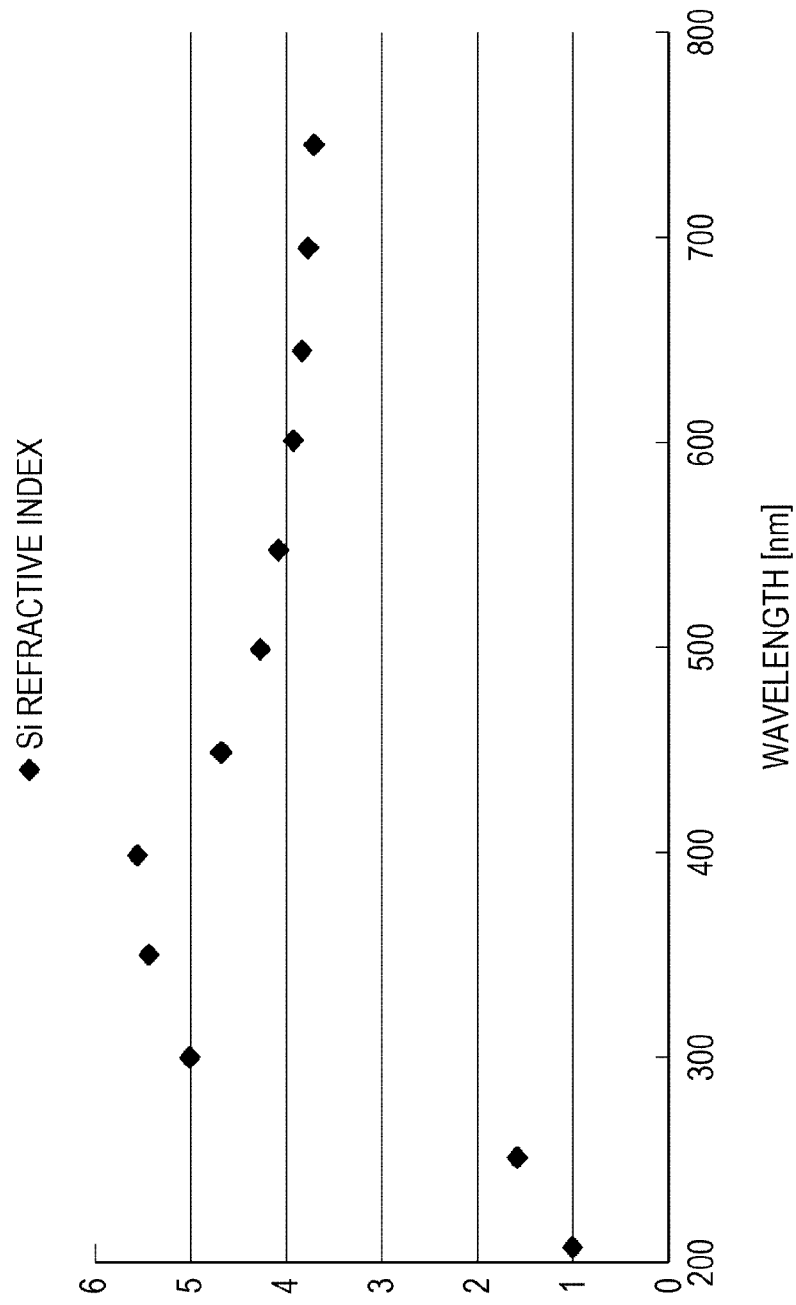
FIG. 14 is a graph illustrating a refractive index of single crystal Si.
Figure 15:
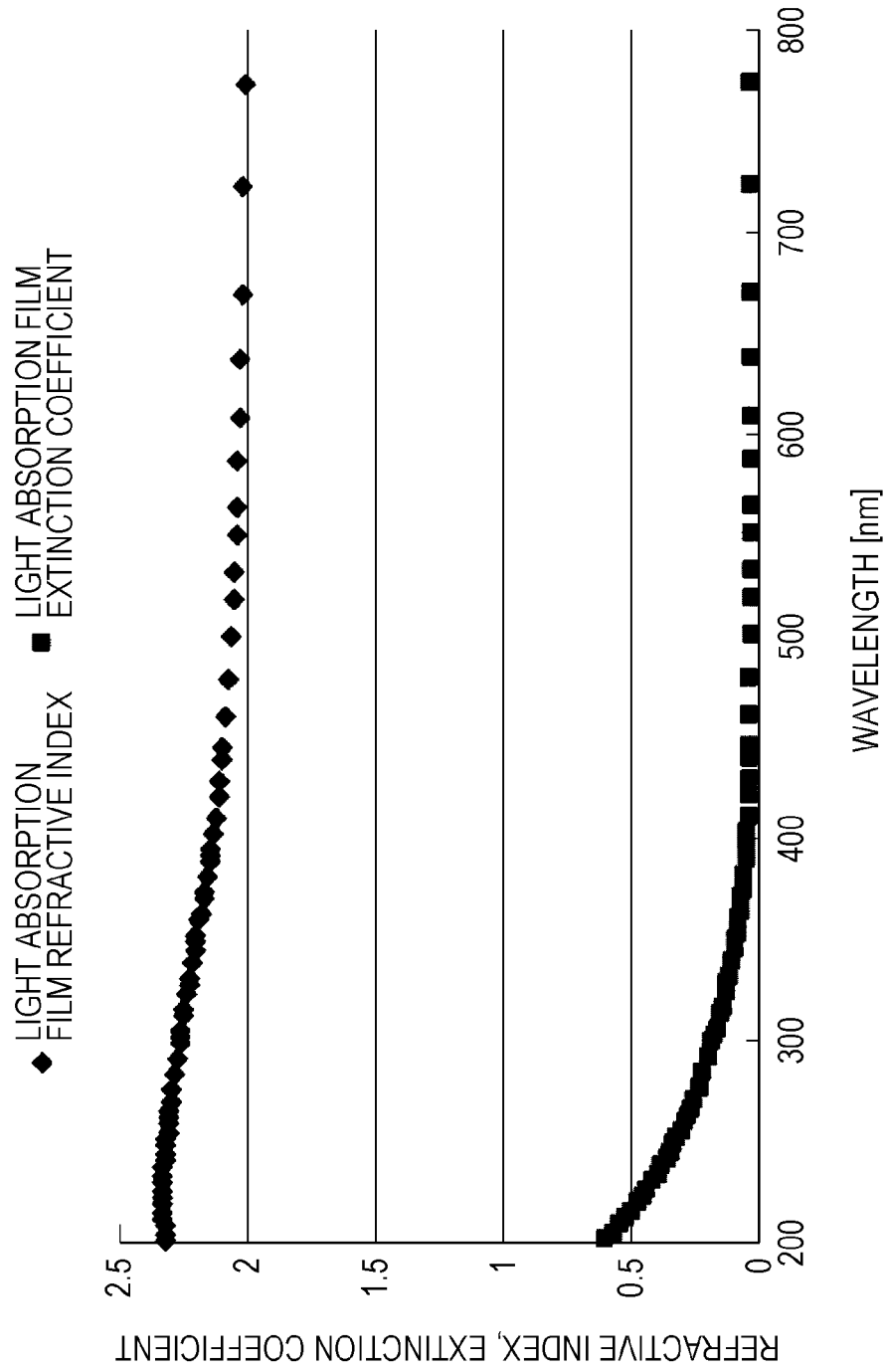
FIG. 15 is a graph illustrating a refractive index and extinction coefficient of a SiN film.

FIG. 14 is a graph illustrating the refractive index of single crystal Si. FIG. 15 is a graph illustrating the refractive index and the extinction coefficient of a SiN film. In FIGS. 14 and 15, a horizontal axis indicates the wavelength, and a vertical axis indicates the refractive index or the extinction coefficient.

Figure 16:
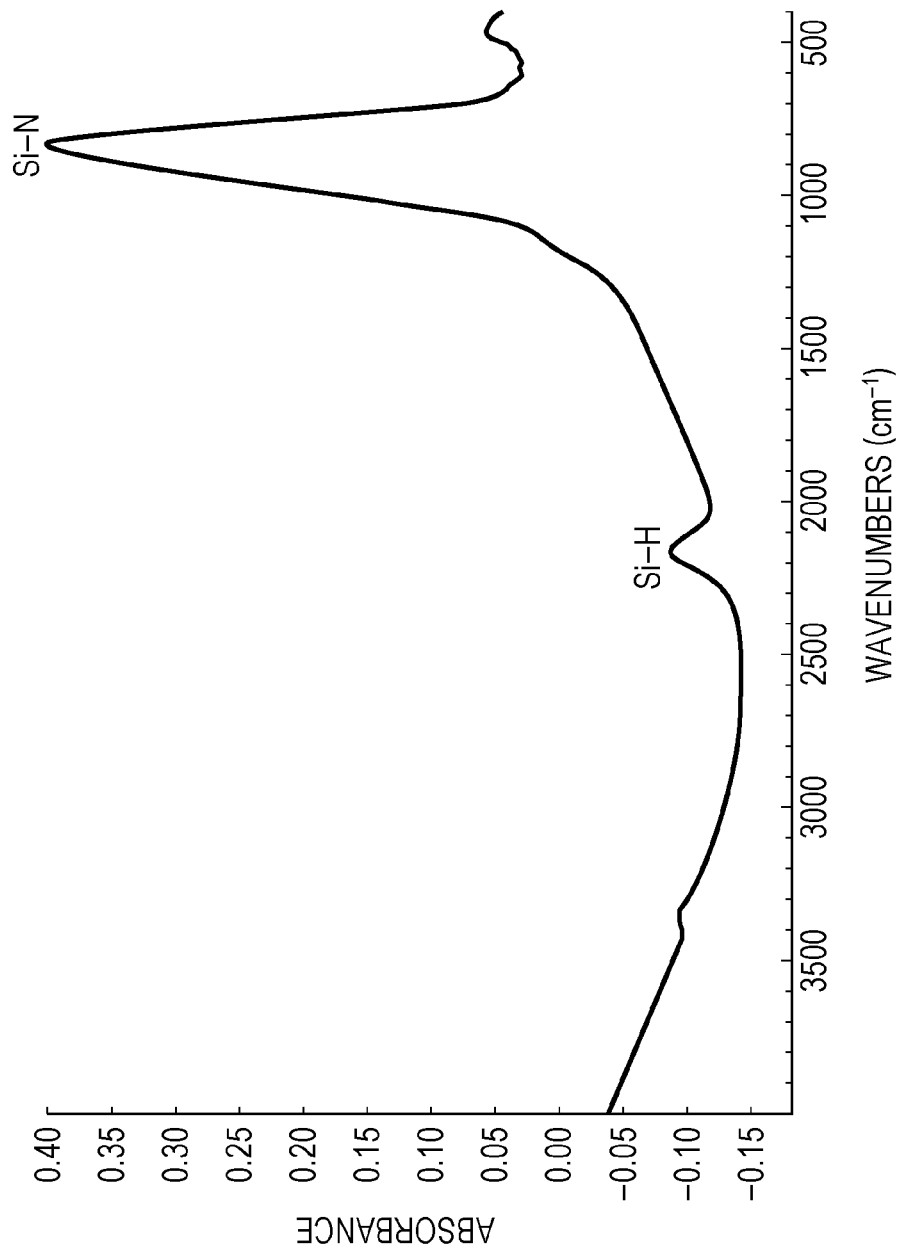
FIG. 16 is a graph illustrating a FTIR (Fourier Transform Infrared absorption) spectrum of the SiN film.

FIG. 16 is a graph illustrating a FTIR (Fourier Transform Infrared absorption) spectrum of the SiN film. In FIG. 16, a horizontal axis indicates wavenumbers, and the vertical axis indicates absorbance.

As illustrated in FIG. 14, in a visible light region (360 to 830 nm), the refractive index of the single crystal Si configuring the semiconductor substrate 101 (refer to FIG. 3) is about 4. In contrast, the refractive index of the SiN configuring the pixel separation portion 301 (refer to FIG. 3) is about 2 as illustrated in FIG. 15. In this way, since the refractive index difference between the semiconductor substrate 101 and the pixel separation portion 301 is great, the entire incident light H entering the photodiode 21 is reflected at the interface between the semiconductor substrate 101 and the pixel separation portion 301. Moreover, the light reflected at the interface enters the photodiode 21 again and performs a photoelectric conversion. Therefore, in the present embodiment, sensitivity can be improved.

In addition, as illustrated in FIG. 15, the extinction coefficient of the SiN is increased in a region in which the wavelength is 400 nm or less. Moreover, as illustrated in FIG. 16, by a Si—H connection, absorption is generated with respect to the light in which the wavelength is 450 nm. Thereby, in the pixel separation portion 301 configured by the SiN, the light having the shorter wavelength like the blue light, which is not reflected at the interface, can be selectively absorbed.

Therefore, in the present embodiment, occurrence of the "color mixing" is prevented, and it is possible to improve color reproducibility in the captured color image.

Thus, in the present embodiment, it is possible to improve an image quality.

(D) Modification

In the above, the case where the pixel separation portion 301 (refer to FIG. 3) is formed by a silicon nitride (SiN) is described. However, the present disclosure is not limited thereto.

The pixel separation portion 301 may be formed by using an inorganic light absorption material such as $SiO_2$, SiCN, and SiOC and may absorb the light of the shorter wavelength side.

Moreover, as described below, the pixel separation portion 301 may be formed by an organic light absorption material.

(D-1) Modification 1-1

The pixel separation portion 301 may be formed by using a photosensitive resin (black resist), which contains a black pigment such as a carbon black, as a light absorption material of an insulator.

Figure 17:
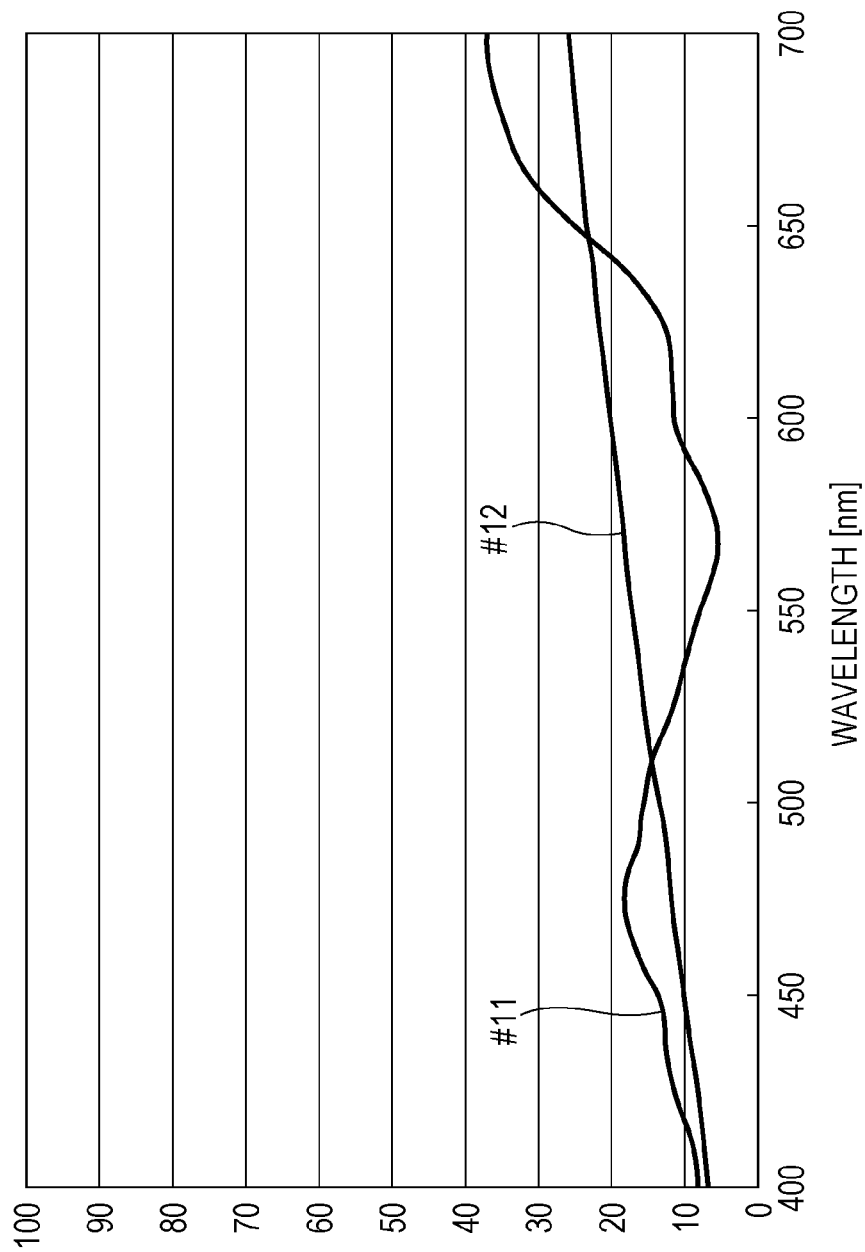
FIG. 17 is a graph illustrating a transmissivity of a photosensitive resin containing a black pigment.

FIG. 17 is a graph illustrating the transmissivity of the photosensitive resin containing the black pigment.

In FIG. 17, a horizontal axis indicates the wavelength and a vertical axis indicates the transmissivity.

FIG. 17 illustrates a case of a light absorption material of the following condition.

Material Name of Black Pigment: a carbon based pigment or a mixture based pigment of a copper phthalocyanine based pigment and a pyridone azo based pigment.
    Material Name of Photosensitive Resin: acrylic material
    Content of Black Pigment: 10 to 50%
    Content of Photosensitive Resin: 10 to 70%
    Thickness: 0.3 to 3 μm Moreover, in FIG. 17, #11 illustrates the result in the case where the mixture based pigment of the copper phthalocyanine based pigment and the pyridone azo based pigment is used. #12 illustrates the result in the case where the carbon based pigment is used.

As can be seen from the result illustrated in FIG. 17, due to the fact that the photosensitive resin (black resist) containing the black pigment is used as a light absorption material, the pixel separation portion 301 having the lower transmissivity over the whole visible light region can be formed.

Therefore, since the pixel separation portion 301 absorbs and shields the light from one pixel toward the photodiodes 21 of other pixels, occurrence of the "color mixing" can be appropriately prevented, and it is possible to improve color reproducibility in the captured color image.

Thus, it is possible to improve an image quality.

Besides this, in the present modification, since the photosensitive resin (black resist) containing the black pigment is used as the light absorption material, an embedding property into the trench is preferable.

(D-2) Modification 1-2

Similarly to the color filter CF of three primary colors described above, the pixel separation portion 301 may be formed by using a color filter material containing primary color system pigments of red, green, and blue as the light absorption material of the insulator. Moreover, the color filter material including complementary color system pigments of yellow, magenta, and cyan may be used as the light absorption material of the insulator. That is, the pixel separation portion 301 may be formed by using color resists such as a red resist, a green resist, a blue resist, a yellow resist, a magenta resist, and a cyan resist.

Figure 18A:
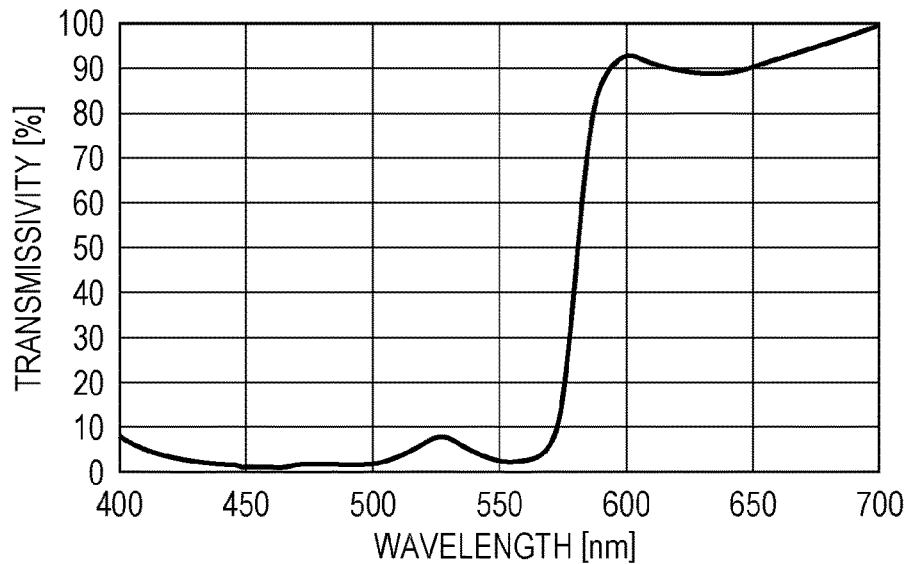
FIGS. 18A to 18C are graphs illustrating a transmissivity of a photosensitive resin containing a primary color system pigment.
Figure 18B:
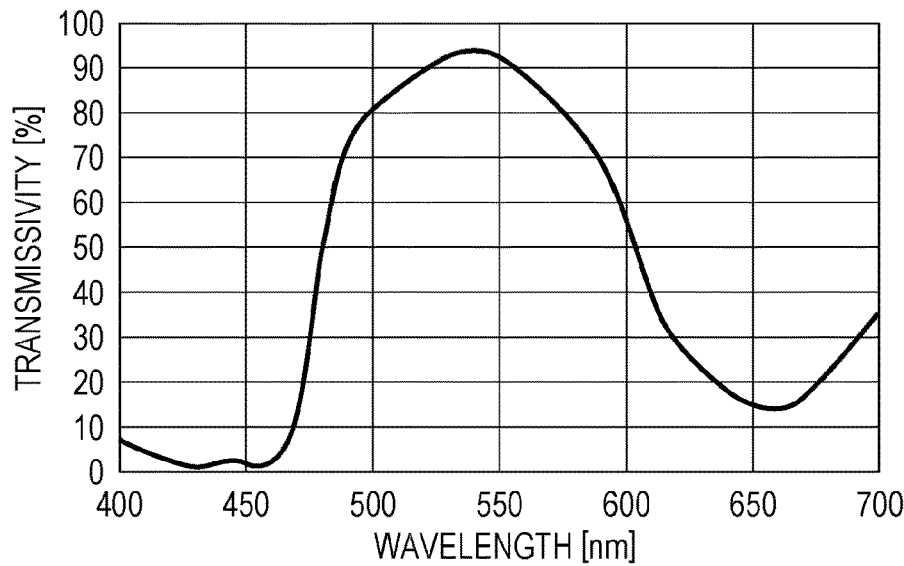
Figure 18C:
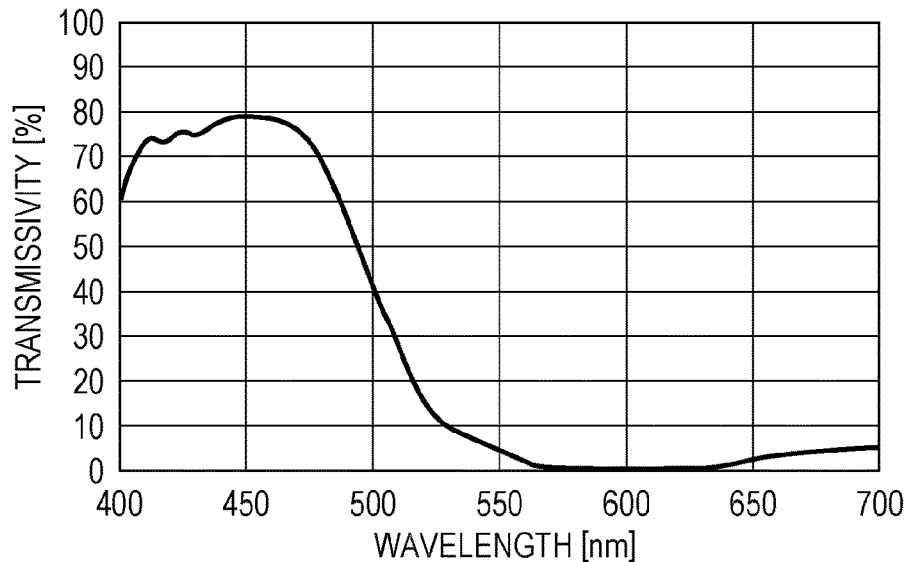

FIGS. 18A to 18C are graphs illustrating a transmissivity of a photosensitive resin containing a primary color system pigment. In FIGS. 18A to 18C, FIG. 18A represents the case of a red filter material (red resist), FIG. 18B represents the case of a green filter material (green resist), and FIG. 18C represents the case of a blue filter material (blue resist).

Figure 19A:
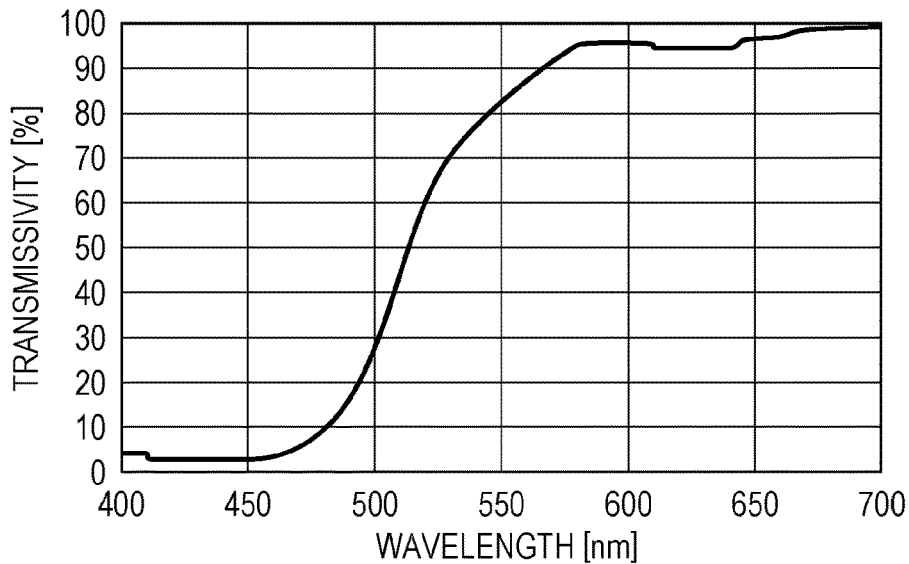
FIGS. 19A to 19C are graphs illustrating a transmissivity of a photosensitive resin containing a complementary color system pigment.
Figure 19B:
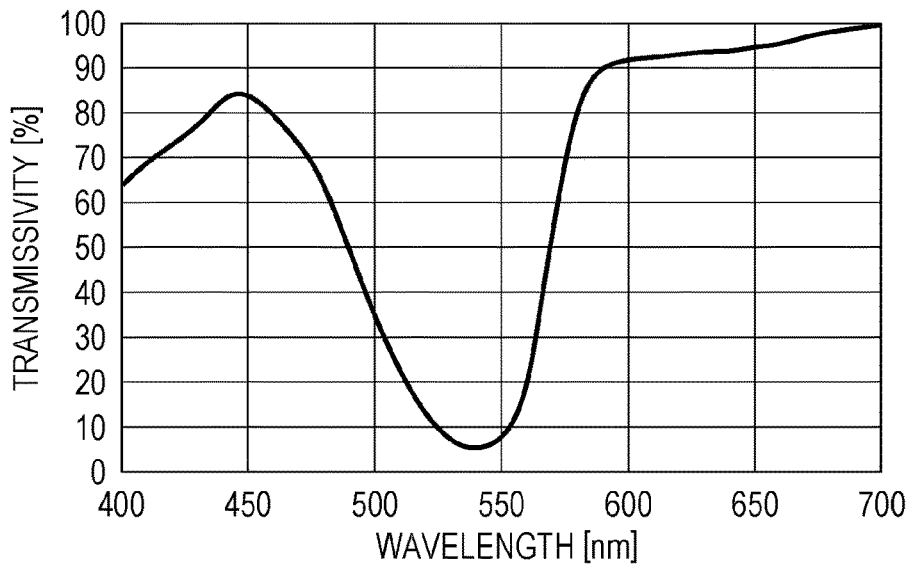
Figure 19C:
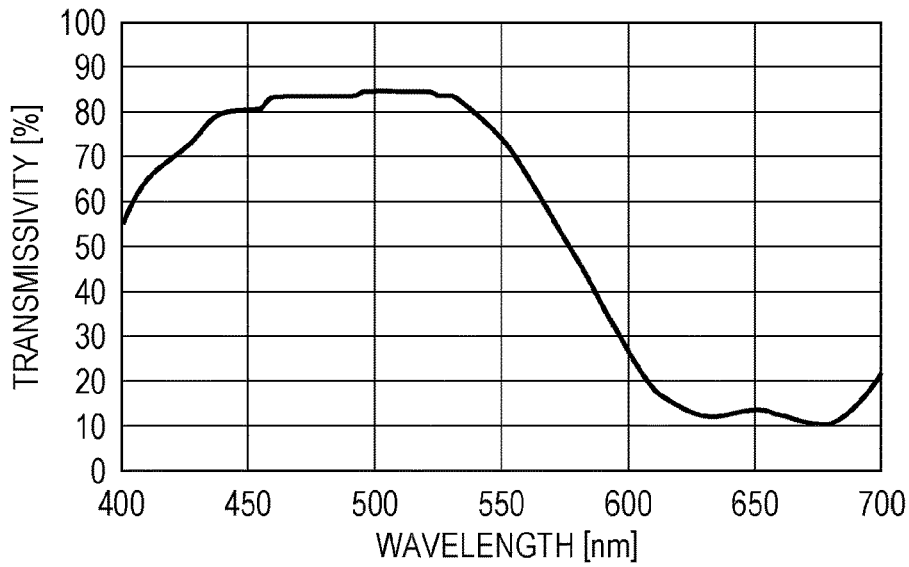

FIGS. 19A to 19C are graphs illustrating the transmissivity of a photosensitive resin containing a complementary color system pigment. In FIGS. 19A to 19C, FIG. 19A represents the case of a yellow filter material (yellow resist), FIG. 19B represents the case of a magenta filter material (magenta resist), and FIG. 19C represents the case of a cyan filter material (cyan resist).

In FIGS. 18A to 18C and 19A to 19C, a horizontal axis indicates a wavelength and a vertical axis indicates a transmissivity.

For example, FIGS. 18A to 18C and 19A to 19C illustrate a case of a light absorption material of the following condition.

Material Name of Each Pigment
    Blue: a triphenylmethane based pigment
    Green: an azo (chromium complex) based and triphenylmethane based pigment
    Red: an azo (chromium complex) based pigment
    Cyan: a copper phthalocyanine based pigment
    Magenta: a xanthene pigment
    Yellow: a pyridone azo pigment
    Material Name of Photosensitive Resin: a novolac based resin
    Content of Each Pigment: 10 to 50%
    Content of Photosensitive Resin: 10 to 70%

As can be seen from the result illustrated in FIGS. 18A to 18C and 19A to 19C, due to the fact that the photosensitive resin containing each pigment is used as the light absorption material, the pixel separation portion 301 having the lower transmissivity in a portion of a visible light region can be formed.

For example, like blue, in a case where the light having the shorter wavelength in visible light is absorbed by the pixel separation portion 301, the pixel separation portion 301 is formed by a material used in the green filter, the red filter, and the yellow filter. Since the transmissivity of the material is lower with respect to the light having the shorter wavelength in visible light, the material can appropriately absorb and shield the light of the wavelength.

Like green, in a case where the light having an intermediate wavelength in visible light is absorbed by the pixel separation portion 301, the pixel separation portion 301 is formed by a material used in the blue filter, the red filter, and the magenta filter. Since the transmissivity of the material is lower with respect to the light having an intermediate wavelength in visible light, the material can appropriately absorb and shield the light of the wavelength.

Like red, in a case where the light having the longer wavelength in visible light is absorbed by the pixel separation portion 301, the pixel separation portion 301 is formed by a material used in the blue filter and the green filter. Since the transmissivity of the material is lower with respect to the light having the longer wavelength in visible light, the material can appropriately absorb and shield the light of the wavelength.

Thereby, since the pixel separation portion 301 absorbs and shields the light from one pixel toward the photodiodes 21 of other pixels, occurrence of the "color mixing" can be appropriately prevented, and it is possible to improve color reproducibility in the captured color image.

Thus, it is possible to improve an image quality.

Moreover, like the present embodiment, the photolithography characteristic in the case where the color resist is used is more suitable that in the case where the black resist is used. Since the black resist absorbs light, the photolithography in the deeper region may be difficult to perform.

2. Second Embodiment (A) Device Configuration or the Like

Figure 20:
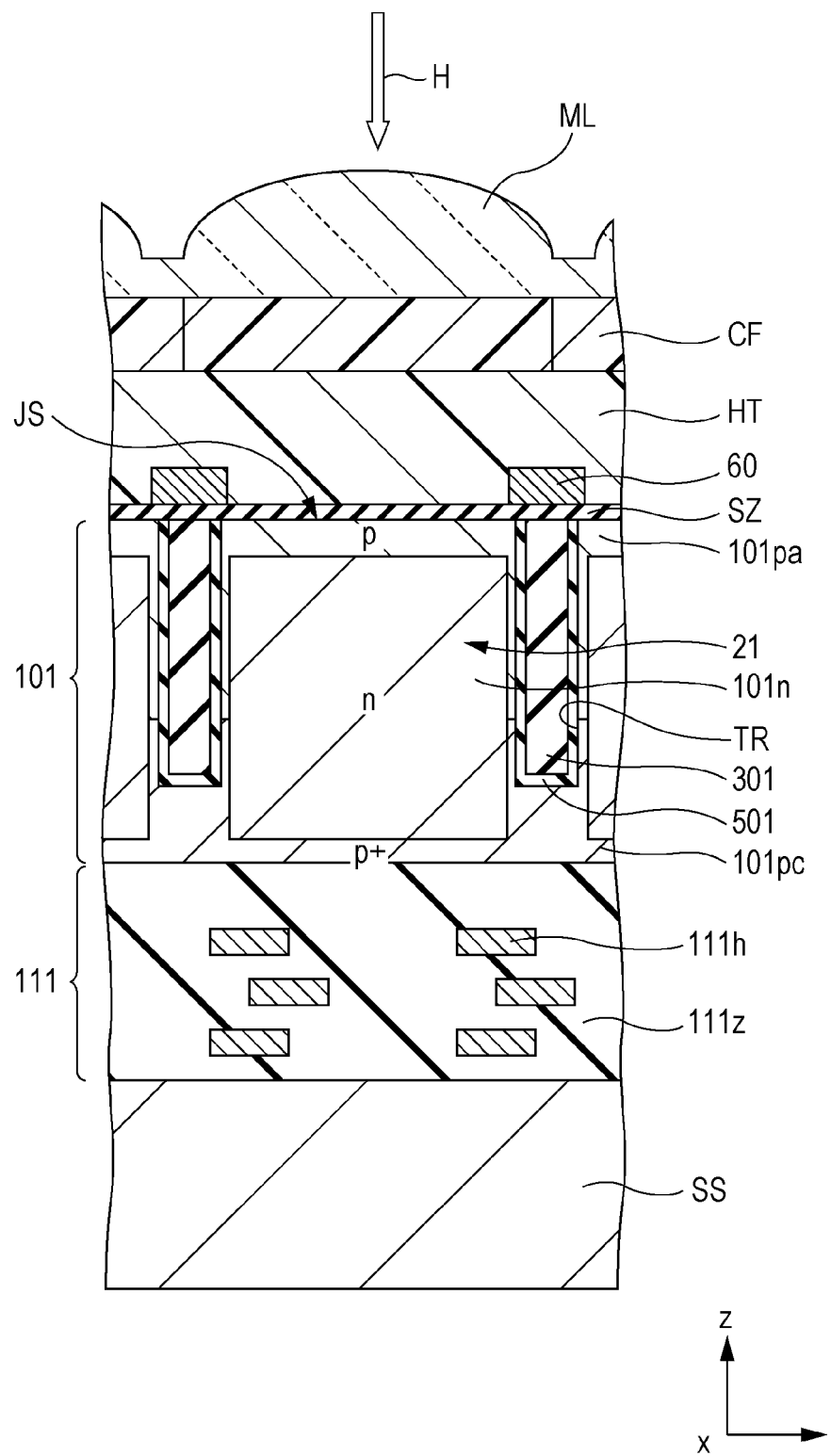
FIG. 20 is a diagram illustrating a main portion of a solid-state imaging device in a second embodiment of the present disclosure.

FIG. 20 is a diagram illustrating a main portion of a solid-state imaging device in a second embodiment of the present disclosure.

Similarly to FIG. 3, FIG. 20 illustrates the cross-section of the pixel P.

As illustrated in FIG. 20, a pinning layer 501 is provided in the present embodiment. Except for this point and those related to the point, the present embodiment is similar to the first embodiment. Thereby, description is appropriately omitted with respect to the overlapped portions.

As illustrated in FIG. 20, the pinning layer 501 is formed so as to cover around the pixel separation portion 301 which divides between a plurality of pixels P in the side of the rear surface (upper surface) of the semiconductor substrate 101.

Specifically, the pinning layer 501 is formed so as to cover the surface of the inside of the trench, which is formed on the rear surface (upper surface) side in the semiconductor substrate 101, with a constant thickness. In addition, the pixel separation portion 301 is provided so as to be embedded to the inner portion of the trench which is covered by the pinning layer 501.

Here, the pinning layer 501 is formed by using a high dielectric constant material which has a negative fixed charge so as to form a positive charge (hole) accumulation region in the interface portion with the semiconductor substrate 101 and suppress occurrence of a dark current. Since the pinning layer 501 is formed so as to have a negative fixed charge and an electric field is added to the interface with the semiconductor substrate 101 by the negative fixed charge, the positive charge (hole) accumulation region is formed.

(B) Manufacturing Method

Main portions of a method for manufacturing the above-described solid-state imaging device will be described.

Figure 21:
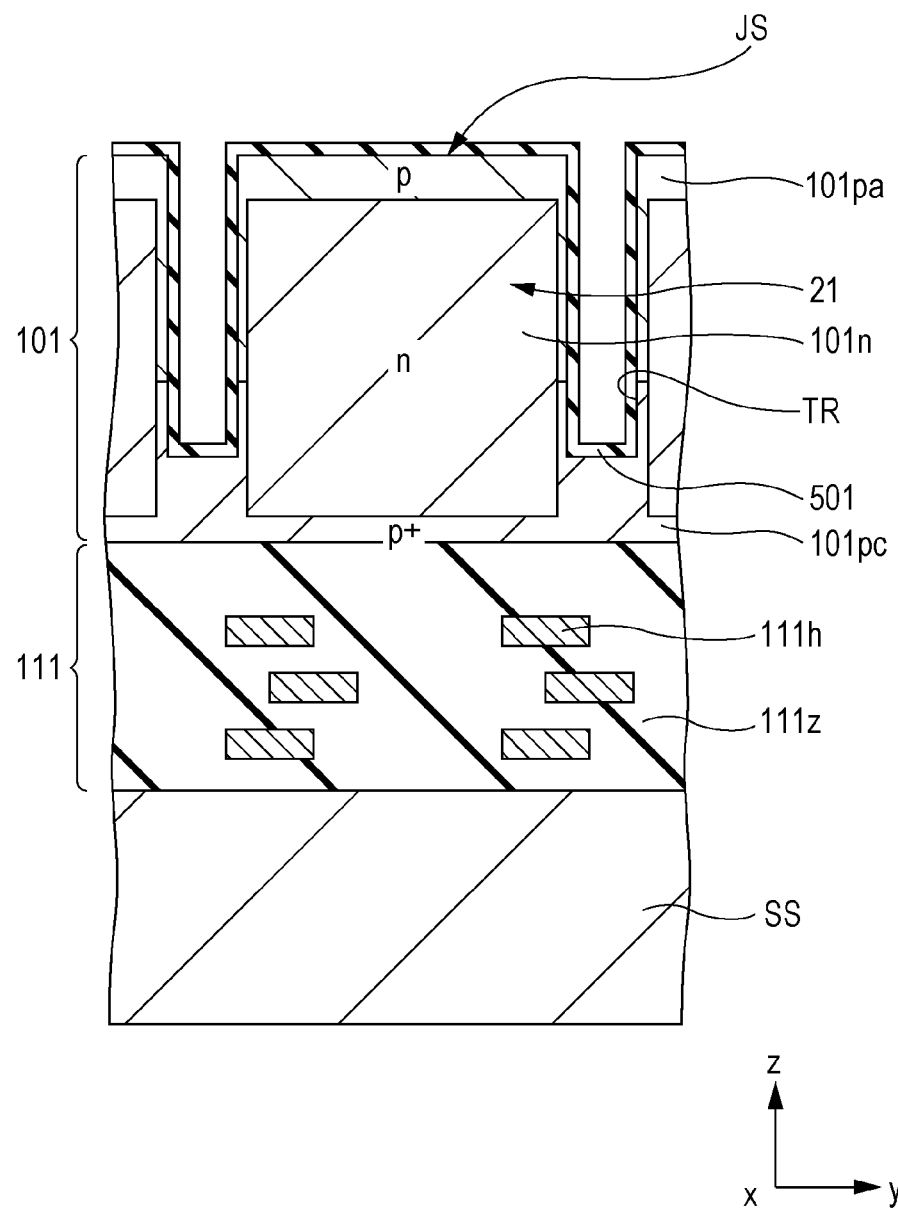
FIG. 21 is a diagram illustrating a method of manufacturing the solid-state imaging device in the second embodiment of the present disclosure.
Figure 22:
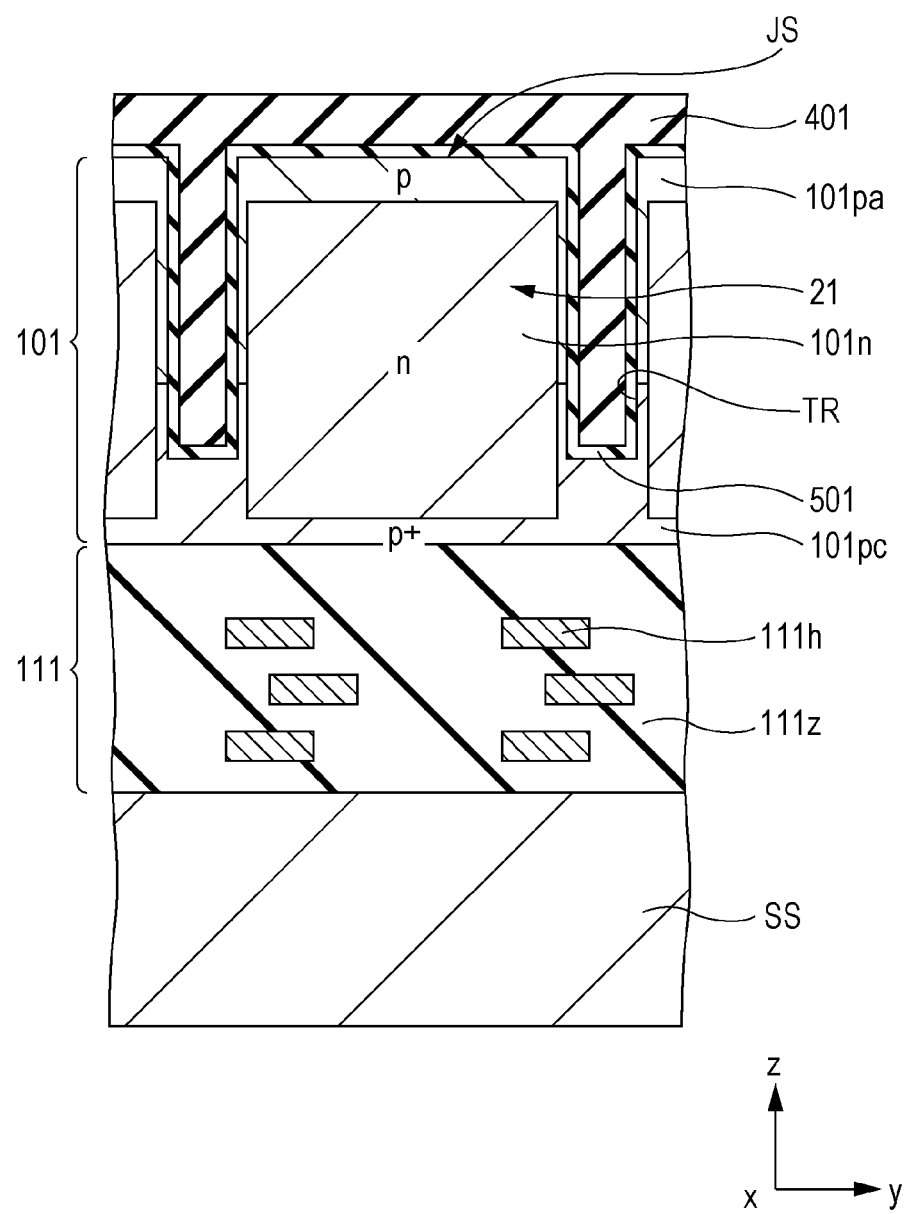
FIG. 22 is a diagram illustrating a method of manufacturing the solid-state imaging device in the second embodiment of the present disclosure.
Figure 23:
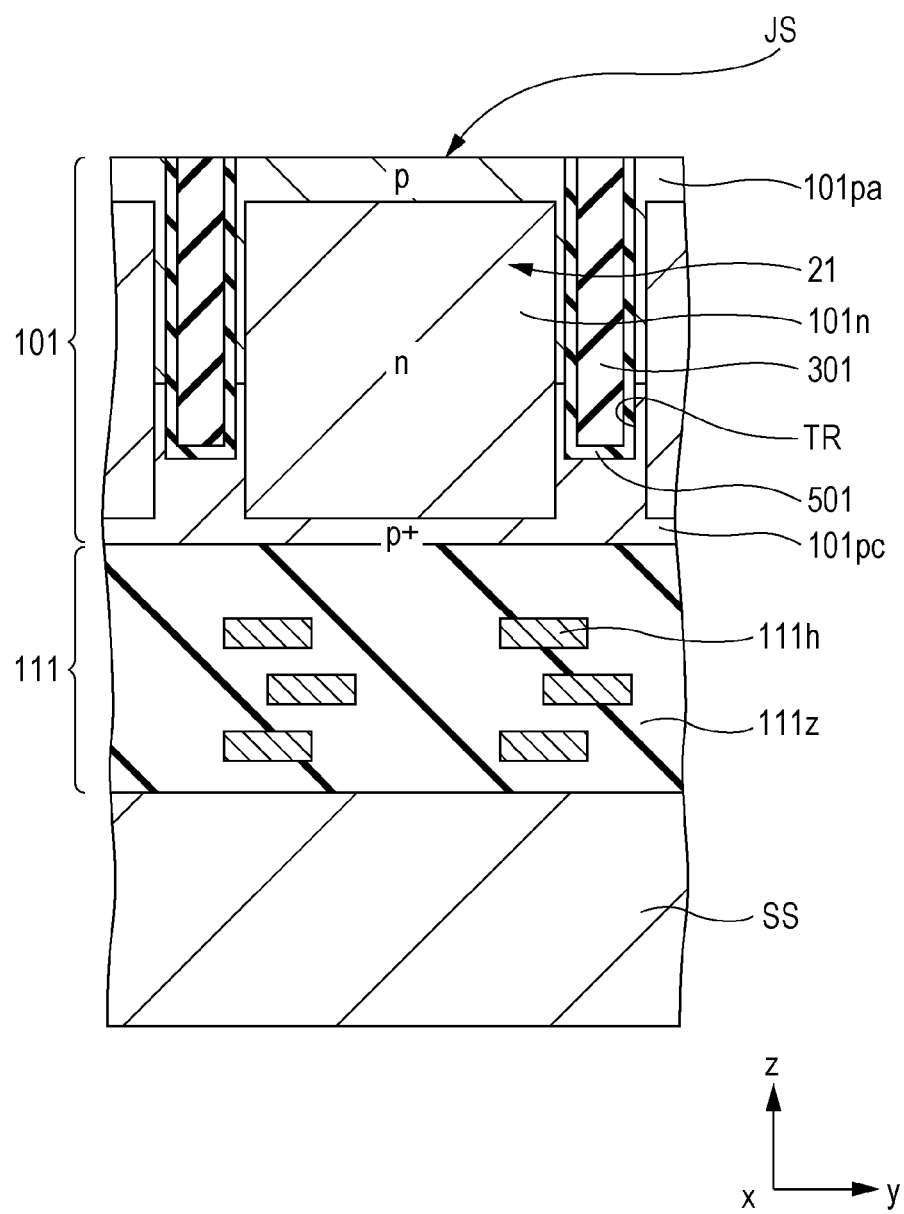
FIG. 23 is a diagram illustrating a method of manufacturing the solid-state imaging device in the second embodiment of the present disclosure.

FIGS. 21 to 23 are diagrams illustrating a method of manufacturing the solid-state imaging device in the second embodiment of the present disclosure.

Similarly to FIG. 20, FIG. 21 to FIG. 23 are illustrated in a cross-section, and the solid-state imaging device illustrated in FIG. 20 is manufactured sequentially through each process illustrated in FIGS. 21 to 23.

Before carrying out each process illustrated in FIGS. 21 to 23, similarly to the first embodiment, the formations of the photodiode 21 or the like, the formation of the trench TR, and the removal of the hard mask HM are performed as illustrated in FIGS. 7 to 9.

(a) Formation of Pinning Layer 501

Next, as illustrated in FIG. 21, the pinning layer 501 is formed.

Here, the pinning layer 501 is formed so as to cover the surface on which the photodiode 21 is formed and the inside surface of the trench TR in the rear surface (upper surface) of the semiconductor substrate 101.

For example, the pinning layer 501 is provided by forming a hafnium oxide film ($HfO_2$ film) of 1 to 20 nm in thickness by the ALD method under a condition of a film formation temperature of 200 to 300° C.

In addition to the hafnium oxide film ($HfO_2$ film), the pinning layer 501 can be formed by using various materials. For example, the pinning layer 501 is formed so as to include at least one of oxides of elemental hafnium, zirconium, aluminum, tantalum, titanium, magnesium, yttrium, lanthanoids, or the like.

Here, it is preferable to form the pinning layer 501 by using a material which has a higher flat band voltage than a silicon oxide film ($SiO_2$ film).

For example, it is preferable to form the pinning layer 501 by using a high dielectric constant (high-k) material below. Moreover, in the following, $\Delta Vfb$ indicates a value which subtracts the flat band voltage Vfb ($SiO_2$) of $SiO_2$ from the flat band voltage Vfb (High-k) of the high-k material (that is, $\Delta Vfb=Vfb(High-k)-Vfb(SiO_2)$).

$Al_2O_3$ ($\Delta Vfb$=4 to 6 V)
$HfO_2$ ($\Delta Vfb$=2 to 3 V)
$ZrO_2$ ($\Delta Vfb$=2 to 3 v)
$TiO_2$ ($\Delta Vfb$=3 to 4 V)
$Ta_2O_5$ ($\Delta Vfb$=3 to 4 V)
$MaO_2$ ($\Delta Vfb$=1.5 to 2.5 V)

(b) Formation of Light Absorption Insulating Film 401

Next, as illustrated in FIG. 22, the light absorption insulating film 401 is formed.

Here, a film of an insulation material which absorbs light is formed on the rear surface (upper surface) of the semiconductor substrate 101 so as to bury the inner portion of the trench TR which is covered by the pinning layer 501.

Thereby, the light absorption insulating film 401 is formed.

For example, similarly to the case of the first embodiment, the light absorption film 401 is formed by forming a silicon nitride film (SiN) by the ALD method.

(c) Formation of Pixel Separation Portion 301

Next, as illustrated in FIG. 23, the pixel separation portion 301 is formed.

Here, in the light absorption insulating material film 401, the portion which is embedded to the inner portion of the trench TR of the semiconductor substrate 101 remains, and the portion on the rear surface (upper surface) of the semiconductor substrate 101 is removed. Similarly, in the pinning layer 501, the portion which is embedded to the inner portion of the trench TR of the semiconductor substrate 101 remains, and the portion on the rear surface (upper surface) of the semiconductor substrate 101 is removed. Thereby, the rear surface (upper surface) of the semiconductor substrate 101 is exposed, and the pixel separation portion 301 is formed from the light absorption insulating film 401.

For example, the rear surface (upper surface) of the semiconductor substrate 101 is exposed by performing a dry etching processing. Besides this, the pixel separation portion 301 may be formed by performing a CMP processing.

(d) Formation of Light Shielding Film 60 or the Like

Next, as illustrated in FIG. 12, each member such as the light shielding film 60 is formed.

Here, similarly to the case of the first embodiment, the light shielding film 60 is pattern-processed and formed. Each member of the planarized film HT, the color filter CF, and the microlens ML is formed.

Thereby, the "rear surface illumination type" of CMOS image sensor is completed.

(C) Conclusion

As described above, in the present embodiment, similarly to the case of the first embodiment, the pixel separation portion 301 is provided in the trench TR which is formed on the rear surface (upper surface) side in the semiconductor substrate 101. Here, the pixel separation portion 301 is formed by an insulation material which absorbs the light incident to the light sensing surface JS.

Therefore, similarly to the first embodiment, in the present embodiment, it is possible to improve an image quality.

In addition, in the present embodiment, the pinning layer 501 is formed so as to cover the surface of the inner portion of the trench TR in the semiconductor substrate 101. Therefore, since positive holes (hole) are excited in the interface with the semiconductor substrate 101 by the pinning layer 501, occurrences of a dark current and a white point can be suppressed.

Therefore, in the present embodiment, it is possible to further improve an image quality.

Moreover, similarly to the modifications illustrated in the first embodiment, also in the present embodiment, the pixel separation portion 301 may be formed by using various light absorption materials.

3. Third Embodiment (A) Device Configuration or the Like

Figure 24:
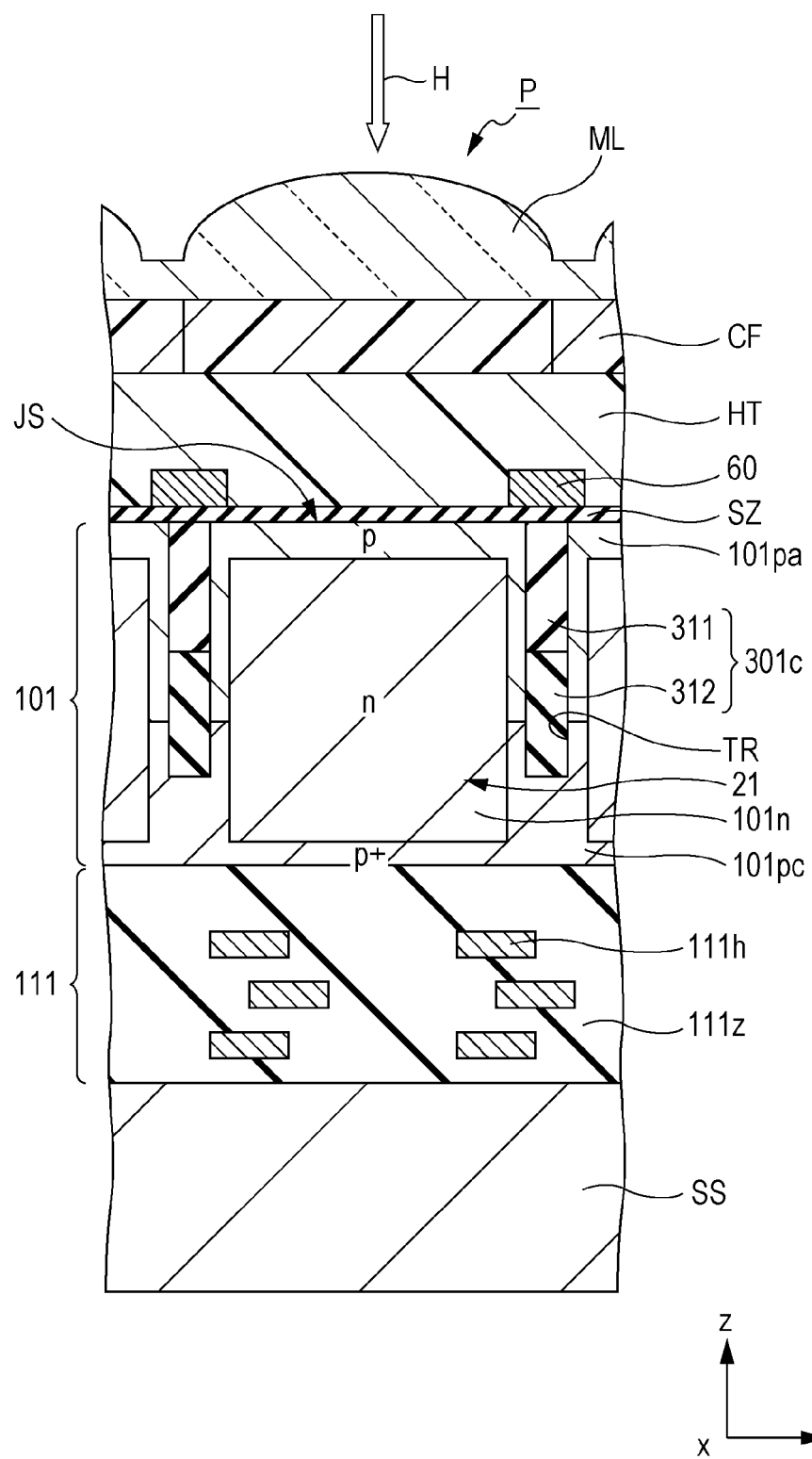
FIG. 24 is a diagram illustrating a main portion of a solid-state imaging device in a third embodiment of the present disclosure.

FIG. 24 is a diagram illustrating a main portion of a solid-state imaging device in a third embodiment of the present disclosure.

Similarly to FIG. 3, FIG. 24 illustrates the cross-section of the pixel P.

As illustrated in FIG. 24, in the present embodiment, a configuration of a pixel separation portion 301c is different from the case of the first embodiment. Except for this point and those related to the point, the present embodiment is similar to the first embodiment. Thereby, description is appropriately omitted with respect to the overlapped portions.

As illustrated in FIG. 24, similarly to the case of the first embodiment, the pixel separation portion 301c is embedded to the inner portion of the semiconductor substrate 101 in the rear surface (upper surface) side of the semiconductor substrate 101. That is, the pixel separation portion 301c is provided in the trench TR which is formed on the rear surface (upper surface) side in the semiconductor substrate 101.

Moreover, the pixel separation portion 301c is formed by an insulation material which absorbs the light incident to the light sensing surface JS.

In the present embodiment, as illustrated in FIG. 24, the pixel separation portion 301c includes a first light absorption portion 311 and a second light absorption portion 312 unlike the case of the first embodiment.

In the pixel separation portion 301c, the first light absorption portion 311 and the second light absorption portion 312 are provided from the rear surface (upper surface) side of the semiconductor substrate 101 in the trench TR which is provided in the semiconductor substrate 101. That is, in the pixel separation portion 301c, the second light absorption portion 312 is formed at the bottom portion side of the trench TR which is provided in the semiconductor substrate 101, and the first light absorption portion 311 is formed so as to be laminated on the second light absorption portion 312 in the upper portion side of the trench TR.

The first light absorption portion 311 and the second light absorption portion 312 are each formed by a light absorption material different from each other, and the wavelength ranges which absorb light are different from each other.

Specifically, in the pixel separation portion 301c, the first light absorption portion 311 is formed so as to absorb the light having the wavelength range of the shortest wavelength in the light having a plurality of different wavelength ranges which enters the light sensing surface JS via the color filter CF.

For example, the first light absorption portion 311 is formed by using a silicon nitride film (SiN), which is formed by an ALD method, as a light absorption material of an insulator. That is, the transmissivity of the first light absorption portion 311 is lower with respect to a blue light having the shorter wavelength, and the first light absorption portion 311 is formed so as to selectively absorb the shorter wavelength light (refer to FIG. 15).

In contrast, the second light absorption portion 312 is formed so as to absorb the light of the wavelength range having the longer wavelength than the wavelength of the light absorbed by the first light absorption portion 311 in the light having a plurality of different wavelength ranges which enters the light sensing surface JS via the color filter CF.

For example, the second light absorption portion 312 is formed by using a color filter material (red resist), which contains a primary color system pigment of red, as a light absorption material of an insulator. That is, the second light absorption portion 312 is formed so that the transmissivity is higher for red light having the longer wavelength and is lower for green light and blue light having a shorter wavelength than that of the red light (refer to FIG. 18A).

In the above-described pixel separation portion 301c, the second light absorption portion 312 is formed on the bottom portion of the trench TR which is provided in the semiconductor substrate 101. Thereafter, the first light absorption portion 311 is formed so as to be laminated on the second light absorption portion 312. Thereby, the pixel separation portion 301c is formed.

For example, the first light absorption portion 311 and the second light absorption portion 312 are formed according to the following condition.

Thickness of First Light Absorption Portion 311: 0.3 to 1 μm.

Thickness of Second Light Absorption Portion 312: 1 to 2 μm.

(B) Conclusion

As described above, similarly to the case of the first embodiment, in the present embodiment, the pixel separation portion 301c is provided in the trench TR which is formed on the rear surface (upper surface) side in the semiconductor substrate 101. Here, the pixel separation portion 301c is formed by an insulation material which absorbs the light incident to the light sensing surface JS.

Thereby, similarly to the first embodiment, in the present embodiment, it is possible to improve an image quality.

Moreover, in the present embodiment, the pixel separation portion 301c includes the first light absorption portion 311 and the second light absorption portion 312. The wavelength ranges, which absorb light in the first light absorption portion 311 and the second light absorption portion 312, are different from each other.

Thereby, in the present embodiment, since the pixel separation portion 301c can absorb the light in a wider wavelength range, occurrence of the "color mixing" can be appropriately prevented.

Moreover, in the present embodiment, in the pixel separation portion 301c, the first light absorption portion 311 and the second light absorption portion 312 are provided from the rear surface (upper surface) side in the trench TR which is provided in the semiconductor substrate 101.

Here, the second light absorption portion 312 is formed so as to absorb so as to absorb the light of the wavelength range having the longer wavelength than the wavelength of the light absorbed by the first light absorption portion 311. That is, the pixel separation portion 301c is formed so that the transmissivity with respect to the light having the shorter wavelength is lower in the portion of the rear surface (upper surface) side into which the incident light H enters in the semiconductor substrate 101, and the transmissivity with respect to the light having the longer wavelength is lower in the deeper portion than the rear surface (upper surface) side portion.

Thereby, in the present embodiment, the first light absorption portion 311 can appropriately absorb the light of the shorter wavelength (for example, blue light) which reaches the vicinity of the rear surface of the semiconductor substrate 101 but does not reach the deeper portion (refer to FIG. 15 or the like). Moreover, the second light absorption portion 312 can appropriately absorb the light of the longer wavelength (for example, green light) which reaches the deeper portion of the semiconductor substrate 101 (refer to FIG. 18A). Thereby, in the present embodiment, occurrence of the "color mixing" can be effectively prevented.

(C) Modification

In the above, in the pixel separation portion 301c, the case where the first light absorption portion 311 is formed by a silicon nitride (SiN) and the second light absorption portion 312 is formed by using a red resist is described. However, the present disclosure is not limited thereto. Each portion may be formed by using an inorganic light absorption material such as $SiO_2$, SiCN, and SiOC.

In addition, both the first light absorption portion 311 and the second light absorption portion 312 may be formed by an organic light absorption material.

(C-1) Modification 3-1

For example, the first light absorption portion 311 is formed by using a red resist, and the second light absorption portion 312 is formed by using a blue resist. Thereby, the first light absorption portion 311 can appropriately absorb the shorter wavelength light (for example, blue light) which reaches the vicinity of the rear surface of the semiconductor substrate 101 but does not reach the deeper portion (refer to FIG. 18A or the like). Moreover, the second light absorption portion 312 can appropriately absorb the light of the longer wavelength (for example, green light and red light) which reaches the deeper portion of the semiconductor substrate 101 (refer to FIG. 18C).

Besides this, similarly to the modification illustrated in the first embodiment, the first light absorption portion 311 and the second light absorption portion 312 may each be formed by using various light absorption materials.

(C-2) Modification 3-2

In addition, the material which forms the first light absorption portion 311 and the second light absorption portion 312 may be changed according to the combination of the wavelength ranges of the light which are received by each of adjacent pixels P in between each of the adjacent pixels P.

Moreover, the thickness (depth) which forms the first light absorption portion 311 and the second light absorption portion 312 may be changed according to the combination of the wavelength ranges of the light which are received by each of the adjacent pixels P in between each of the adjacent pixels P.

For example, as illustrated in FIG. 4, the first light absorption portion 311 is formed by using a blue resist between the pixel P which receives a red light and the pixel P which receives a green light. Thereby, the green light which has the shorter wavelength than the red light is absorbed by the first light absorption portion 311 of the upper portion.

Moreover, the second light absorption portion 312 is formed by a green resist. Therefore, the red light which has the longer wavelength than the green light is absorbed by the second light absorption portion 312 of the lower portion.

In this case, it is preferable that the first light absorption portion 311 of the upper portion and the second light absorption portion 312 of the lower portion are formed according to the following condition.

Thickness of First Light Absorption Portion 311 (blue resist): 0.3 to 1 μm
Thickness of Second Light Absorption Portion 312 (green resist): 1 to 2 μm In addition, as illustrated in FIG. 4, the first light absorption portion 311 is formed by using a red resist between the pixel P which receives the blue light and the pixel p which receives the green light.

Thereby, the blue light which has the shorter wavelength than the green light is absorbed by the first light absorption portion 311 of the upper portion. Moreover, the second light absorption portion 312 is formed by a blue resist. Therefore, the green light which has the longer wavelength than the blue light is absorbed by the second light absorption portion 312 of the lower portion.

In this case, it is preferable that the first light absorption portion 311 of the upper portion and the second light absorption portion 312 of the lower portion are formed according to the following condition.

Thickness of First Light Absorption Portion 311 (red resist): 0.3 to 1 μm
Thickness of Second Light Absorption Portion 312 (blue resist): 1 to 2 μm As described above, it is preferable that the first light absorption portion 311 of the upper portion is formed by using a light absorption material which absorbs the light having the shorter wavelength and the second light absorption portion 312 of the lower portion is formed by a light absorption material which absorbs the light having the longer wavelength. That is, it is preferable that the second light absorption portion 312 is formed so as to absorb the light of the wavelength range having the longer wavelength than the wavelength of the light absorbed by the first light absorption portion 311.

Thereby, the incidence of the light having the shorter wavelength is possible in the upper portion of the semiconductor substrate 101, and the incidence of the light having the longer wavelength is possible in the lower portion.

4. Fourth Embodiment (A) Device Configuration or the Like

Figure 25:
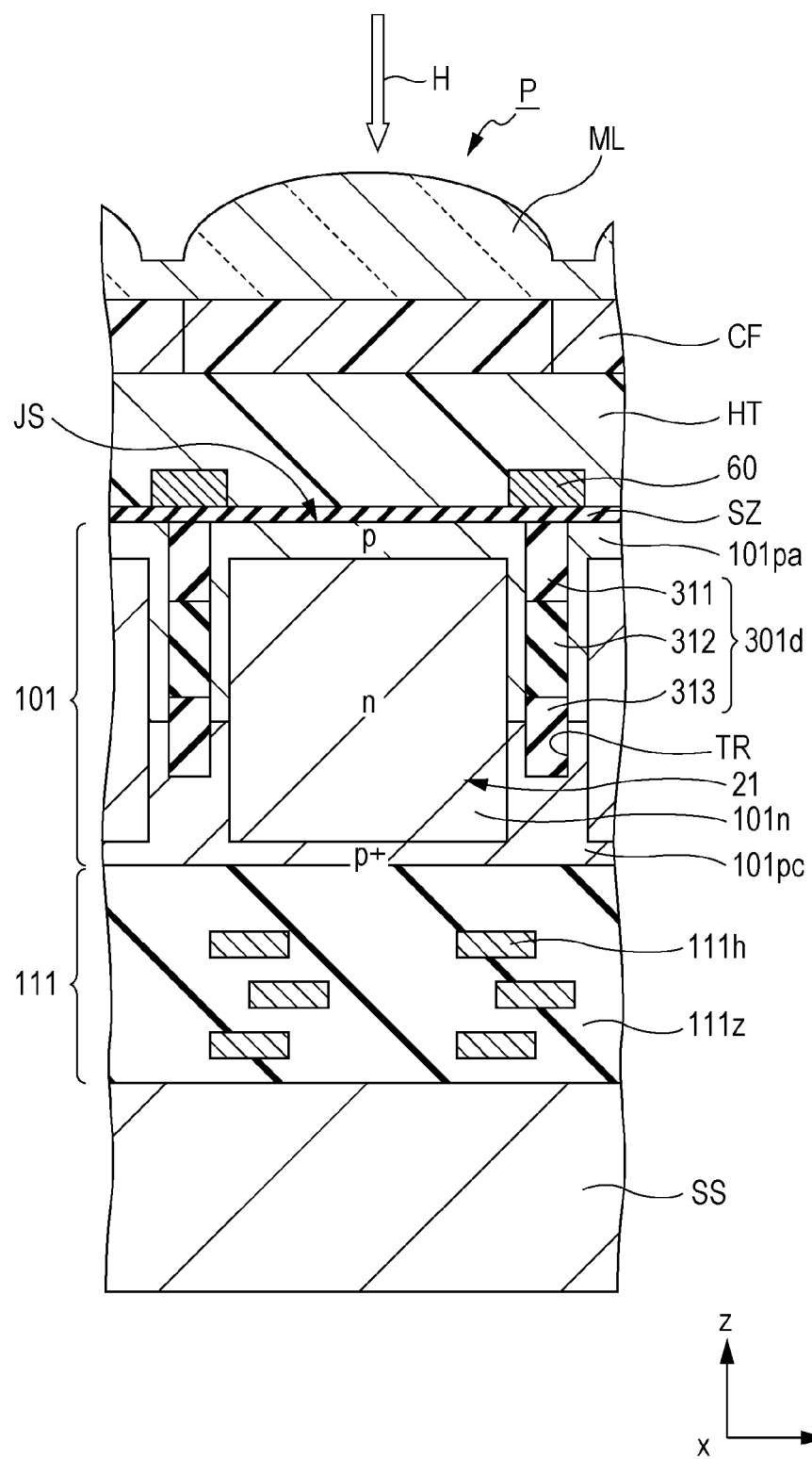
FIG. 25 is a diagram illustrating a main portion of a solid-state imaging device in a fourth embodiment of the present disclosure.

FIG. 25 is a diagram illustrating a main portion of a solid-state imaging device in a fourth embodiment of the present disclosure.

Similarly to FIG. 24, FIG. 25 illustrates the cross-section of the pixel P.

As illustrated in FIG. 25, in the present embodiment, a configuration of a pixel separation portion 301d is different from the case of the third embodiment. Except for this point and those related to the point, the present embodiment is similar to the third embodiment. Thereby, description is appropriately omitted with respect to the overlapped portions.

As illustrated in FIG. 25, similarly to the case of the third embodiment, the pixel separation portion 301d is embedded to the inner portion of the semiconductor substrate 101 in the rear surface (upper surface) side of the semiconductor substrate 101. That is, the pixel separation portion 301d is provided in the trench TR which is formed on the rear surface (upper surface) side in the semiconductor substrate 101.

Moreover, the pixel separation portion 301d is formed by an insulation material which absorbs the light incident to the light sensing surface JS.

In the present embodiment, as illustrated in FIG. 25, the pixel separation portion 301d includes a third light absorption portion 313 in addition to the first light absorption portion 311 and the second light absorption portion 312 unlike the case of the third embodiment.

In the pixel separation portion 301d, the first light absorption portion 311, the second light absorption portion 312, and the third light absorption portion 313 are provided from the rear surface (upper surface) side of the semiconductor substrate 101 in the trench TR which is provided in the semiconductor substrate 101. That is, in the pixel separation portion 301d, the third light absorption portion 313 is formed at the bottom portion side of the trench TR which is provided in the semiconductor substrate 101. In addition, the second light absorption portion 312 is formed so as to be laminated on the third light absorption portion 313 in inner portion of the trench TR. Moreover, the first light absorption portion 311 is formed so as to be laminated on the second light absorption portion 312 in the upper portion side of the trench TR.

The first light absorption portion 311, the second light absorption portion 312, and the third light absorption portion 313 each are formed by a light absorption material different from one another, and the wavelength ranges which absorb the light are different from one another.

For example, the first light absorption portion 311 is formed by using a color filter material (green resist), which contains a primary color system pigment of green, as a light absorption material of an insulator. That is, the first light absorption portion 311 is formed so that the transmissivity is higher in the green light having an intermediate wavelength and is lower in the light having the shorter wavelength or the longer wavelength than that of the green light (refer to FIG. 18B).

For example, the second light absorption portion 312 is formed by using a color filter material (blue resist), which contains a primary color system pigment of blue, as a light absorption material of an insulator. That is, the second light absorption portion 312 is formed so that the transmissivity is higher in the blue light having the shorter wavelength and is lower in the light having the longer wavelength than that of the blue light (refer to FIG. 18C).

For example, the third light absorption portion 313 is formed by using a color filter material (red resist), which contains a primary color system pigment of a red, as a light absorption material of an insulator. That is, the third light absorption portion 313 is formed so that the transmissivity is higher in the red light having the longer wavelength and is lower in the light having the shorter wavelength than that of the red light (refer to FIG. 18A).

In the above-described pixel separation portion 301d, the third light absorption portion 313 is formed on the bottom portion of the trench TR which is provided in the semiconductor substrate 101. In addition, the second light absorption portion 312 is formed so as to be laminated on the third light absorption portion 313. Thereafter, the first light absorption portion 311 is formed so as to be laminated on the second light absorption portion 312. Thereby, the pixel separation portion 301d is formed.

For example, the first light absorption portion 311, the second light absorption portion 312, and the third light absorption portion 313 are formed according to the following condition.

Thickness of First Light Absorption Portion 311: 0.3 to 1 μm.
Thickness of Second Light Absorption Portion 312: 1 to 2 μm.
Thickness of Third Light Absorption Portion 313: 1 to 2 μm.

(B) Conclusion

As described above, similarly to the case of the first embodiment, in the present embodiment, the pixel separation portion 301d is provided in the trench TR which is formed on the rear surface (upper surface) side in the semiconductor substrate 101. Here, the pixel separation portion 301d is formed by an insulation material which absorbs the light incident to the light sensing surface JS.

Thereby, similarly to the first embodiment, in the present embodiment, it is possible to improve an image quality.

Moreover, in the pixel separation portion 301d of the present embodiment, the wavelength ranges, which absorb light in each of the first light absorption portion 311, the second light absorption portion 312, and the third light absorption portion 313, are different from one another. In addition, in the pixel separation portion 301d, the first light absorption portion 311, the second light absorption portion 312, and the third light absorption portion 313 are provided from the rear surface (upper surface) side of the semiconductor substrate 101 in the trench TR which is provided in the semiconductor substrate 101. Thereby, in the present embodiment, since the pixel separation portion 301d can absorb the light of the wider wavelength range, occurrence of the "color mixing" can be appropriately prevented.

(C) Modification

In the above, in the pixel separation portion 301d, the case where the first light absorption portion 311, the second light absorption portion 312, and the third light absorption portion 313 are each formed by using an organic light absorption material is described. However, the present disclosure is not limited thereto.

Similarly to other embodiments, each portion may be formed by using an inorganic light absorption material such as SiN, SiO$_2$, SiCN, and SiOC.

Moreover in the above, the first light absorption portion 311 is formed by a green resist (G), the second light absorption portion 312 is formed by a blue resist (B), and the third light absorption portion 313 is formed by a red resist (R). However, the present disclosure is not limited thereto.

For example, the first light absorption portion 311 may be formed by a red resist (R), the second light absorption portion 312 may be formed by a green resist (G), and the third light absorption portion 313 may be formed by a blue resist (B). That is, the second light absorption portion 312 may be formed so as to absorb the light of the wavelength range having the longer wavelength than the wavelength of the light absorbed by the first light absorption portion 311, and the third light absorption portion 313 may be formed so as to absorb the light of the wavelength range having the longer wavelength than the wavelength of the light absorbed by the second light absorption portion 312. In this case, similarly to the case of the third embodiment, the pixel separation portion 301d is formed so that the transmissivity of the light having the shorter wavelength is lower in the portion of the rear surface (upper surface) side into which the incident light H enters and the transmissivity of the light having the longer wavelength is lower in the deeper portion in the semiconductor substrate 101. Thereby, similarly to the third embodiment, occurrence of the "color mixing" can be effectively prevented.

Moreover, in the above, the case where the pixel separation portion includes total three light absorption portions is described. However, the present disclosure is not limited thereto. The pixel separation portion may include more than three light absorption portions.

5. Fifth Embodiment (A) Device Configuration

Figure 26:
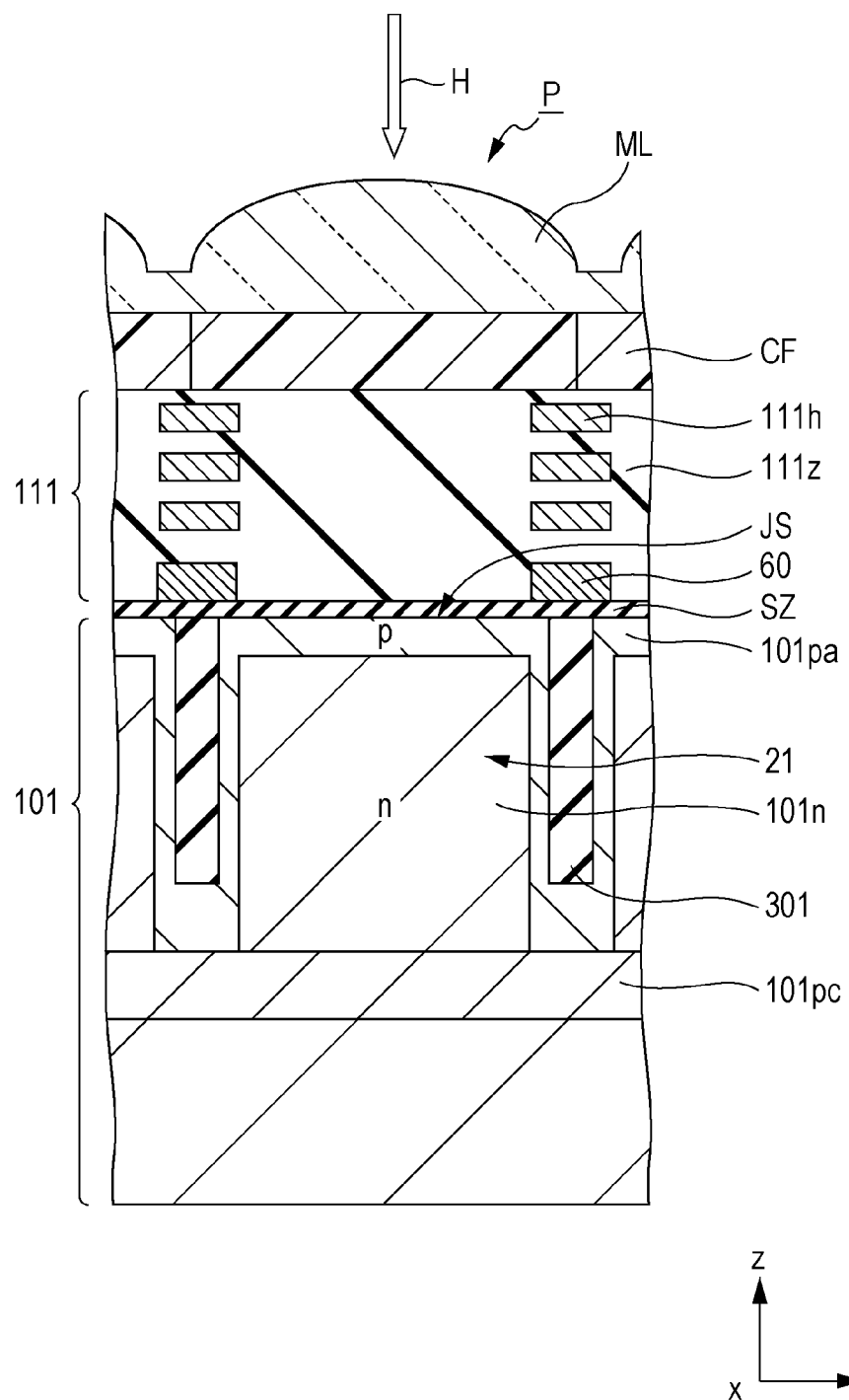
FIG. 26 is a diagram illustrating a main portion of a solid-state imaging device in a fifth embodiment of the present disclosure.

FIG. 26 is a diagram illustrating a main portion of a solid-state imaging device in a fifth embodiment of the present disclosure.

Similarly to FIG. 3, FIG. 26 illustrates the cross-section of the pixel P.

As illustrated in FIG. 26, the solid-state imaging device is a "front surface illumination type". That is, the solid-state imaging device is configured so that the wiring layer 111 is provided in the front surface (upper surface in FIG. 26) side of the semiconductor substrate 101 and the light sensing surface JS receives the incident light H incident from the front surface side. Moreover, the supporting substrate SS (refer to FIG. 3) is provided. Except for this point and those related to the point, the present embodiment is similar to the first embodiment. Thereby, description is appropriately omitted with respect to the overlapped portions.

In the present embodiment, as illustrated in FIG. 26, in the solid-state imaging device, the photodiode 21 and the pixel separation portion 301 are provided in the inner portion of the semiconductor substrate 101.

As illustrated in FIG. 26, the photodiode 21 is provided so that the n-type semiconductor region 101n is positioned in the inner portion of the p-type semiconductor region 101pa and 101pc at the front surface (upper surface) side of the semiconductor substrate 101.

As illustrated in FIG. 26, the pixel separation portion 301 is embedded to the inner portion of the semiconductor substrate 101 in the front surface (upper surface) side of the semiconductor substrate 101. That is, the pixel separation portion 301 is provided in the trench TR which is formed on the front surface (upper surface) side in the semiconductor substrate 101. Similarly to the first embodiment, the pixel separation portion 301 is formed by an insulation material which absorbs the light incident to the light sensing surface JS.

The light shielding film 60 is provided on the front surface (upper surface) of the semiconductor substrate 101 similarly to the first embodiment, and the wiring layer 111 is provided so as to cover the light shielding film 60.

In the wiring layer 111, the wirings 111h are provided on a portion other than the upper portion of the light sensing surface JS in the insulation layer 111z.

Moreover, similarly to the first embodiment, the color filter CF and the microlens ML are provided on the upper surface of the wiring layer 111.

Although not illustrated in FIG. 26, the pixel transistor Tr illustrated in FIG. 5 is provided on the front surface (upper surface) of the semiconductor substrate 101. The wiring layer 111 is provided so as to cover the pixel transistor Tr.

(B) Conclusion

As described above, in the present embodiment, similarly to the case of the first embodiment, the pixel separation portion 301 is provided in the trench TR which is formed on the rear surface (upper surface) side in the semiconductor substrate 101. Here, the pixel separation portion 301 is formed by an insulation material which absorbs the light incident to the light sensing surface JS.

Therefore, in the present embodiment, similarly to the first embodiment, it is possible to improve an image quality.

As described above, the solid-state imaging device of the present embodiment is the "front surface illumination type". As described above, in the case of the "front surface illumination type", since the pixel separation portion is formed by ion-implanting impurities from the front surface side into which the incident light enters in the semiconductor substrate, it is difficult to improve the saturation charge accumulation amount (Qs) of the pixel which receives the light having the longer wavelength such as a red light.

However, in the present embodiment, the pixel separation portion 301 is embedded to the inner portion of the trench TR which is provided at the side portions of the photodiode 21 in the semiconductor substrate 101. Thereby, since the pixel P can be separated at the deeper region with respect to the light sensing surface JS, particularly, in the photodiode 21 which receives the red light, the saturation charge accumulation amount (Qs) can be great, and a dynamic range can be improved.

Moreover, in the present embodiment, the case where the pixel separation portion 301 is formed similarly to the case of the first embodiment is described. However, the present disclosure is not limited to thereto. That is, the pixel separation portion may be formed similarly to the cases of other embodiments and modifications.

6. Others

When the present disclosure is performed, the present disclosure is not limited to the above-described embodiments. That is, the present disclosure can adopt various modifications.

In the above-described embodiments, the case where the present disclosure is applied to the camera is described. However, the present disclosure is not limited thereto. That is, the present disclosure may be also applied to other electronic apparatuses including a solid-state imaging device such as a scanner or a copier.

In the above-described embodiments, the case where four kinds of the transfer transistor, the amplifying transistor, the selection transistor, and the reset transistor are provided as the pixel transistor is described. However, the present disclosure is not limited thereto. For example, the present disclosure may be also applied to a case where three kinds of the transfer transistor, the amplifying transistor, and the reset transistor are provided as the pixel transistor.

In the above-described embodiments, the case where each of the transfer transistor, the amplifying transistor, the selection transistor, and the reset transistor is provided to one photodiode one by one is described. However, the present disclosure is not limited thereto. For example, the present disclosure may be also applied to a case where each of the amplifying transistor, the selection transistor, and the reset transistor is provided to a plurality of photodiodes one by one.

Moreover, the present disclosure may be applied to a CCD type image sensor in addition to the CMOS type image sensor.

In addition, the above-described embodiments may be appropriately combined.

Moreover, the solid-state imaging device 1 in the above-described embodiments corresponds to the solid-state imaging device of the present disclosure. In addition, the photodiode 21 in the above-described embodiments corresponds to the photoelectric conversion portion of the present disclosure. Moreover, the camera 40 in the above-described embodiments corresponds to the electronic apparatus of the present disclosure. In addition, the light shielding film 60 in the above-described embodiments corresponds to the light shielding film of the present disclosure. Moreover, the semiconductor substrate 101 in the above-described embodiments corresponds to the semiconductor substrate of the present disclosure. In addition, the wiring layer 111 in the above-described embodiments corresponds to the wiring layer of the present disclosure. Moreover, the pixel separation portion 301, 301c, and 301d in the above-described embodiments corresponds to the pixel separation portion of the present disclosure. In addition, the first light absorption portion 311 in the above-described embodiments corresponds to the first light absorption portion of the present disclosure. Moreover, the second light absorption portion 312 in the above-described embodiments corresponds to the second light absorption portion of the present disclosure. In addition, the third light absorption portion 313 in the above-described embodiments corresponds to the third light absorption portion of the present disclosure. In addition, the pinning layer 501 in the above-described embodiments corresponds to the pinning layer of the present disclosure. Moreover, the color filter CF in the above-described embodiments corresponds to the color filter of the present disclosure. In addition, the blue filter layer CFB in the above-described embodiments corresponds to the filter layer or the first filter layer of the present disclosure. Moreover, the green filter layer CFG in the above-described embodiments corresponds to the filter layer or the second filter layer of the present disclosure. In addition, the red filter layer CFR in the above-described embodiments corresponds to the filter layer or the third filter layer of the present disclosure. Moreover, the light sensing surface JS in the above-described embodiments corresponds to the light sensing surface of the present disclosure. In addition, the pixel P in the above-described embodiments corresponds to the pixel of the present disclosure. Moreover, the trench TR in the above-described embodiments corresponds to the trench of the present disclosure. In addition, the pixel transistor Tr in the above-described embodiments corresponds to the pixel transistor of the present disclosure.

It should be understood by those skilled in the art that various modifications, combinations, sub-combinations and alterations may occur depending on design requirements and other factors insofar as they are within the scope of the appended claims or the equivalents thereof.

What is claimed is:

1. An imaging device comprising:
   a semiconductor substrate having a first side as a light-incident side and a second side opposite to the first side;
   a plurality of photoelectric conversion portions disposed in the semiconductor substrate;
   a trench disposed between adjacent photoelectric conversion portions of the plurality of photoelectric conversion portions;
   a wiring layer disposed adjacent to the second side of the semiconductor substrate;
   a first material disposed in the trench; and
   a silicon oxide layer disposed above the first material and the first side of the semiconductor substrate, and
   a light-shielding portion disposed above the silicon oxide layer,
   wherein the first material includes silicon oxide.

2. The imaging device of claim 1, wherein the first material does not extend across the first side of the semiconductor substrate to an adjacent trench.

3. The imaging device of claim 1, wherein the light-shielding portion includes titanium.

4. The imaging device of claim 3, wherein the light-shielding portion includes titanium nitride.

5. The imaging device of claim 1, wherein the light-shielding portion includes a first layer and a second layer.

6. The imaging device of claim 5, wherein the first layer includes titanium nitride, and the second layer includes tungsten.

7. The imaging device of claim 6, wherein the second layer is disposed above the first layer.

8. The imaging device of claim 1, wherein the silicon oxide layer extends from the trench to an adjacent trench.

9. The imaging device of claim 1, wherein the silicon oxide layer contacts the first material and the semiconductor substrate.

10. The imaging device of claim 9, further comprising:
    a transparent film disposed on the light-shielding portion and the silicon oxide layer.

11. An imaging device comprising:
    a semiconductor substrate having a first side as a light-incident side and a second side opposite to the first side;
    a plurality of photoelectric conversion portions disposed in the semiconductor substrate;
    a trench disposed between adjacent photoelectric conversion portions of the plurality of photoelectric conversion portions;
    a wiring layer disposed adjacent to the second side of the semiconductor substrate;
    a first material disposed in the trench;
    a second material disposed in the trench;
    a silicon oxide layer disposed above the first material and the first side of the semiconductor substrate; and
    a light-shielding portion disposed above the silicon oxide layer,
    wherein the first material includes silicon material, and
    wherein the second material includes oxide material.

12. The imaging device of claim 11, wherein the first material and the second material do not extend across the first side of the semiconductor substrate to an adjacent trench.

13. The imaging device of claim 11, wherein the second material is disposed at an outer region of the trench, and wherein the first material is disposed at an inner region of the trench.

14. The imaging device of claim 11, wherein the silicon oxide layer extends from the trench to an adjacent trench.

15. The imaging device of claim 14, wherein the light-shielding portion is disposed above the trench.

16. The imaging device of claim 11, wherein an upper surface of the first material and an upper surface of the second material are coplanar.

17. The imaging device of claim 16, wherein the silicon oxide layer contacts the first material, the second material, and the semiconductor substrate.

18. The imaging device of claim 11, further comprising:
    a transparent film disposed on the light-shielding portion and the silicon oxide layer.

19. An imaging device comprising:
    a semiconductor substrate having a first side as a light-incident side and a second side opposite to the first side;
    N-type regions formed in the semiconductor substrate;
    a trench disposed between adjacent N-type regions of the N-type regions;
    a wiring layer disposed adjacent to the second side of the semiconductor substrate;
    a first material disposed in the trench; and
    a silicon oxide layer disposed above the first material and the first side of the semiconductor substrate, and
    wherein the first material includes an oxide of elemental hafnium, aluminum, or tantalum.

20. The imaging device of claim 19, wherein the first material does not extend across the first side to an adjacent trench.

\* \* \* \* \*